US012627115B2

(12) United States Patent
Kaji et al.

(10) Patent No.: US 12,627,115 B2
(45) Date of Patent: May 12, 2026

(54) SEMICONDUCTOR LASER DRIVE DEVICE, ELECTRONIC EQUIPMENT, AND METHOD FOR MANUFACTURING SEMICONDUCTOR LASER DRIVE DEVICE

(71) Applicant: SONY SEMICONDUCTOR SOLUTIONS CORPORATION, Kanagawa (JP)

(72) Inventors: Nobuaki Kaji, Kanagawa (JP); Tatsuya Oiwa, Kanagawa (JP); Hirohisa Yasukawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 859 days.

(21) Appl. No.: 17/760,741

(22) PCT Filed: Jul. 21, 2020

(86) PCT No.: PCT/JP2020/028243
§ 371 (c)(1),
(2) Date: Mar. 15, 2022

(87) PCT Pub. No.: WO2021/059708
PCT Pub. Date: Apr. 1, 2021

(65) Prior Publication Data
US 2022/0344897 A1 Oct. 27, 2022

(30) Foreign Application Priority Data
Sep. 25, 2019 (JP) ................................. 2019-174518

(51) Int. Cl.
*H01S 5/02345* (2021.01)
*H01S 5/02355* (2021.01)

(52) U.S. Cl.
CPC ...... *H01S 5/02345* (2021.01); *H01S 5/02355* (2021.01)

(58) Field of Classification Search
CPC .................................................. H01S 5/02345
See application file for complete search history.

(56) References Cited

U.S. PATENT DOCUMENTS 7,508,047 B2 * 3/2009 Tatum ..................... H01S 5/183
257/E25.032
2004/0247005 A1 * 12/2004 Schrodinger ......... H01S 5/0261
372/38.1
(Continued)

FOREIGN PATENT DOCUMENTS

EP       1848075 A      10/2007
JP    2009-170675       7/2009
(Continued)

OTHER PUBLICATIONS

S. Vainshtein, V. Zemlyakov, V. Egorkin, A. Maslevtsov and A. Filimonov, "Miniature High-Power Nanosecond Laser Diode Transmitters Using the Simplest Possible Avalanche Drivers," in IEEE Transactions on Power Electronics, vol. 34, No. 4, pp. 3689-3699, Apr. 2019, doi: 10.1109/TPEL.2018.2853563. (Year: 2019).*
(Continued)

*Primary Examiner* — Minsun O Harvey
(74) *Attorney, Agent, or Firm* — SHERIDAN ROSS P.C.

(57) ABSTRACT
In a semiconductor laser drive device, wiring inductance between a semiconductor laser and a laser driver is reduced. A substrate has a laser driver built inside. A semiconductor laser is mounted on one surface of a substrate of the semiconductor laser drive device and emits irradiation light from an irradiation surface. A connection wiring electrically connects the laser driver and the semiconductor laser with a wiring inductance of 0.5 nH or less. A passive component is disposed to face a side of the semiconductor laser having the least number of pads and connects to the semiconductor laser and the laser driver.

20 Claims, 25 Drawing Sheets

(56)                    References Cited

U.S. PATENT DOCUMENTS

| | | | |
|---|---|---|---|
| 2007/0237193 A1 | 10/2007 | Finzi | |
| 2014/0119395 A1* | 5/2014 | Dvir ..................... | H04B 10/504 |
| | | | 372/38.01 |
| 2015/0293317 A1 | 10/2015 | Kim et al. | |
| 2017/0026115 A1* | 1/2017 | He .................. | H04B 10/07955 |
| 2018/0098430 A1* | 4/2018 | Sato ................... | H01L 21/4857 |
| 2018/0278011 A1 | 9/2018 | Galvano | |
| 2019/0293764 A1* | 9/2019 | Van Nieuwenhove ..................... | |
| | | | H01S 5/423 |
| 2020/0052460 A1 | 2/2020 | Lee et al. | |

FOREIGN PATENT DOCUMENTS

| | | | | |
|---|---|---|---|---|
| KR | 10-2012-0064509 | 6/2012 | | |
| KR | 101443562 | 11/2014 | | |
| KR | 20180042600 A | 4/2018 | | |
| WO | WO 2018/074672 | 4/2018 | | |
| WO | WO-2018100082 A1 * | 6/2018 | .......... | G01S 17/894 |

OTHER PUBLICATIONS

International Search Report prepared by the European Patent Office on Oct. 6, 2020, for International Application No. PCT/JP2020/028243, 3 pgs.

Written Opinion prepared by the European Patent Office on Oct. 6, 2020, for International Application No. PCT/JP2020/028243, 6 pgs.

* cited by examiner

Fig. 10

ADDITIVE METHOD (H=15 $\mu$m)

| W \ L | 0.3mm | 0.5mm | 1mm | 2mm | 3mm |
|---|---|---|---|---|---|
| 0.015mm | 0.21 | 0.40 | 0.94 | 2.16 | 3.48 |
| 0.05mm | 0.16 | 0.33 | 0.79 | 1.85 | 3.02 |
| 0.1mm | 0.13 | 0.27 | 0.68 | 1.63 | 2.69 |
| 0.2mm | 0.09 | 0.21 | 0.56 | 1.39 | 2.33 |
| 0.3mm | 0.07 | 0.17 | 0.48 | 1.24 | 2.11 |

Fig. 11

SUBTRACTIVE METHOD (H＝35μm)

| W | | L | | | | |
|---|---|---|---|---|---|---|
| | 0.3mm | 0.5mm | 1mm | 2mm | 3mm |
| 0.035mm | 0.16 | 0.32 | 0.77 | 1.82 | 2.98 |
| 0.05mm | 0.15 | 0.30 | 0.73 | 1.75 | 2.86 |
| 0.1mm | 0.12 | 0.25 | 0.65 | 1.57 | 2.59 |
| 0.2mm | 0.09 | 0.20 | 0.54 | 1.35 | 2.27 |
| 0.3mm | 0.07 | 0.17 | 0.47 | 1.22 | 2.07 |

163

171                 172

SEMICONDUCTOR LASER DRIVE DEVICE, ELECTRONIC EQUIPMENT, AND METHOD FOR MANUFACTURING SEMICONDUCTOR LASER DRIVE DEVICE

CROSS REFERENCE TO RELATED APPLICATIONS

This application is a national stage application under 35 U.S.C. 371 and claims the benefit of PCT Application No. PCT/JP2020/028243, having an international filing date of 21 Jul. 2020, which designated the United States, which PCT application claimed the benefit of Japanese Priority Patent Application JP 2019-174518 filed 25 Sep. 2019, the entire disclosures of each contents of which are incorporated herein by reference.

TECHNICAL FIELD

The present technology relates to a semiconductor laser drive device. More specifically, the present technology relates to a semiconductor laser drive device including a substrate with a laser driver built inside and a semiconductor laser, electronic equipment, and a method for manufacturing a semiconductor laser drive device.

BACKGROUND ART

Conventionally, in an electronic device having a distance measuring function, a distance measuring method called time of flight (ToF) has often been used. This ToF is a method in which a light-emitting part irradiates an object with sine-wave or rectangular-wave irradiation light, a light-receiving part receives reflected light from the object, and a distance measuring operation part measures a distance from a phase difference between the irradiation light and the reflected light. There is known an optical module in which a light-emitting element and an electronic semiconductor chip for driving the light-emitting element are housed in a casing and integrated in order to realize the distance measuring function as described above. For example, there has been proposed an optical module including: a laser diode array arrayed and mounted on an electrode pattern of a substrate; and a driver integrated circuit (IC) electrically connected to the laser diode array (e.g., see Patent Literature 1).

CITATION LIST

Patent Literature

PTL 1: JP 2009-170675A

SUMMARY

Technical Problem

In the related art described above, the laser diode array and the driver IC are integrated and configured as an optical module. However, in this related art, the laser diode array and the driver IC are electrically connected by a plurality of wires, and wiring inductance therebetween increases, whereby there is a possibility that the driving waveform of the semiconductor laser may be distorted. This is particularly problematic for ToF driven at hundreds of megahertz.

The present technology has been developed in view of such a situation, and it is desirable to reduce wiring inductance between a semiconductor laser and a laser driver in a semiconductor laser drive device.

Solution to Problem

According to an embodiment of the present technology, there are provided a semiconductor laser drive device and electronic equipment provided with the semiconductor laser drive device, the device including: a substrate with a laser driver built inside; a semiconductor laser mounted on one surface of the substrate; connection wiring that electrically connects the laser driver and the semiconductor laser with a wiring inductance of 0.5 nH or less; and a passive component that is disposed to face a side of the semiconductor laser having the least number of pads and connects to the semiconductor laser and the laser driver. Therefore, the laser driver and the semiconductor laser are electrically connected with a wiring inductance of 0.5 nH or less, and the passive component is disposed to face the side of the semiconductor laser having the least number of pads, thereby having an effect of shortening the wiring length.

Further, in the embodiment the passive component may form a part of a path through which the laser driver drives the semiconductor laser. This brings an effect of shortening the wiring length of the path through which the laser driver drives the semiconductor laser.

Further, in the first embodiment, at least a part of the passive component may be disposed to overlap above the laser driver. This brings an effect of shortening the wiring length between the passive component and the laser driver.

Further, in the embodiment, the passive component may include a capacitor. In this case, the capacitor may be a decoupling capacitor that connects a power supply potential and a ground potential of the laser driver. This brings an effect of reducing high-frequency noise.

Moreover, in the embodiment, the semiconductor laser drive device further includes a photodiode that is disposed to face the side of the semiconductor laser having the least number of pads and monitors light intensity of laser light emitted from the semiconductor laser, in which the laser driver may drive the semiconductor laser on the basis of the light intensity monitored by the photodiode. This brings an effect of ensuring the amount of light incident on the photodiode and improving the incidence sensitivity.

Further, in the embodiment, the connection wiring desirably has a length of 0.5 mm or less. Further, the connection wiring is more preferably 0.3 mm or less.

Further, in the embodiment, the connection wiring may be through a connecting via provided on the substrate. This brings an effect of shortening the wiring length between the semiconductor laser and the laser driver.

Further, in the embodiment, a part of the semiconductor laser may be disposed to overlap above the laser driver. In this case, a portion of 50% or less of an area of the semiconductor laser may be disposed to overlap the laser driver thereabove.

Further, a method for manufacturing a semiconductor laser drive device according to an embodiment of the present technology includes: forming a laser driver on an upper surface of a support plate; forming connection wiring of the laser driver and forming a substrate with the laser driver built inside; mounting a semiconductor laser on one surface of the substrate and forming connection wiring that electrically connects, via the connection wiring, the laser driver and the semiconductor laser with a wiring inductance of 0.5 nH or less; and disposing a passive component connecting the semiconductor laser and the laser driver to face a side of the semiconductor laser having the least number of pads. Therefore, the laser driver and the semiconductor laser are electrically connected with a wiring inductance of 0.5 nH or less, and the passive component is disposed to face the side of the semiconductor laser having the least number of pads, thereby having an effect of manufacturing a semiconductor laser drive device with a short wiring length.

BRIEF DESCRIPTION OF DRAWINGS

FIG. 10 is a diagram illustrating a numerical example of a wiring inductance with respect to a wiring length L and a wiring width W in a case where a wiring pattern is formed by an additive method.

FIG. 11 is a diagram illustrating a numerical example of the wiring inductance with respect to the wiring length L and the wiring width W in a case where a wiring pattern is formed by a subtractive method.

DESCRIPTION OF EMBODIMENTS

Hereinafter, a mode for implementing the present technology (hereinafter referred to as embodiment) will be described. The description will be made in the following order.

1. Embodiment
2. Application Example

1. Embodiment

"Configuration of distance measuring module"

Figure 1:
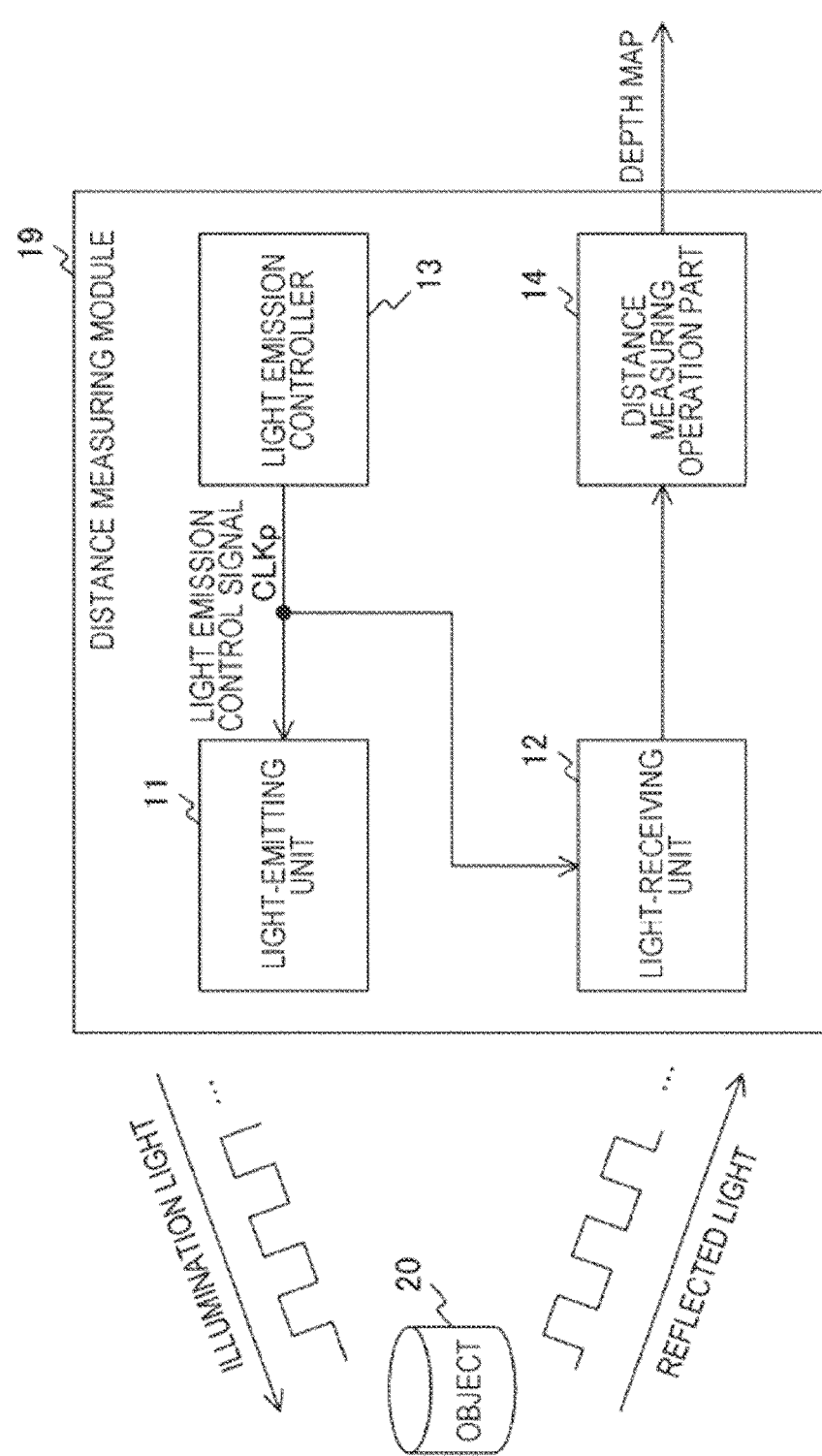
FIG. 1 is a diagram illustrating a configuration example of a distance measuring module 19 according to an embodiment of the present technology.

FIG. 1 is a diagram illustrating a configuration example of a distance measuring module 19 according to an embodiment of the present technology.

The distance measuring module 19 measures a distance by the ToF method, and includes a light-emitting unit 11, a light-receiving unit 12, a light emission controller 13, and a distance measuring operation part 14. Note that the light-emitting unit 11 is an example of the semiconductor laser drive device recited in the claims.

The light-emitting unit 11 emits irradiation light with its brightness varying periodically and irradiates an object 20 with the light. The light-emitting unit 11 generates irradiation light in synchronization with, for example, a rectangular-wave light emission control signal CLKp. Further, for example, a laser or a light-emitting diode is used as the light-emitting unit 11, and infrared light or near-infrared light having a wavelength in the range of 780 nm to 1000 nm is used as the irradiation light. Note that the light emission control signal CLKp is not limited to a rectangular wave so long as being a periodic signal. For example, the light emission control signal CLKp may be a sine wave.

The light emission controller 13 controls the irradiation timing of the irradiation light. The light emission controller 13 generates the light emission control signal CLKp and supplies the generated signal to the light-emitting unit 11 and the light-receiving unit 12. Further, the light emission control signal CLKp may be generated by the light-receiving unit 12, and in that case, the light emission control signal CLKp generated by the light-receiving unit 12 is amplified by the light emission controller 13 and supplied to the light-emitting unit 11. The frequency of the light emission control signal CLKp is, for example, 100 megahertz (MHz). Note that the frequency of the light emission control signal CLKp is not limited to 100 MHz but may be 200 MHz or the like. Further, the light emission control signal CLKp may be a single-ended signal or a differential signal.

The light-receiving unit 12 receives the light reflected from the object 20 and detects the amount of light received within a period of a vertical synchronization signal every time the period elapses. For example, a 60-Hz periodic signal is used as the vertical synchronization signal. Further, in the light-receiving unit 12, a plurality of pixel circuits is arranged in a two-dimensional lattice. The light-receiving unit 12 supplies image data (frames) made up of pieces of pixel data corresponding to the amounts of light received by these pixel circuits to the distance measuring operation part 14. Note that the frequency of the vertical synchronization signal is not limited to 60 Hz but may, for example, be 30 Hz or 120 Hz.

The distance measuring operation part 14 measures the distance to the object 20 on the basis of image data by the ToF method. The distance measuring operation part 14 measures the distance for each pixel circuit, and generates a depth map indicating the distance to the object 20 by a gradation value for each pixel. This depth map is used for, for example, image processing for performing blurring processing with a degree in accordance with the distance, and autofocus (AF) processing for obtaining a focal point of a focus lens in accordance with the distance. Further, the depth map is expected to be used for gesture recognition, object recognition, obstacle detection, augmented reality (AR), virtual reality (VR), and the like.

Note that although the example of the distance measuring module for measuring the distance has been described here, the present technology can be applied to sensing modules in general.

Figure 2:
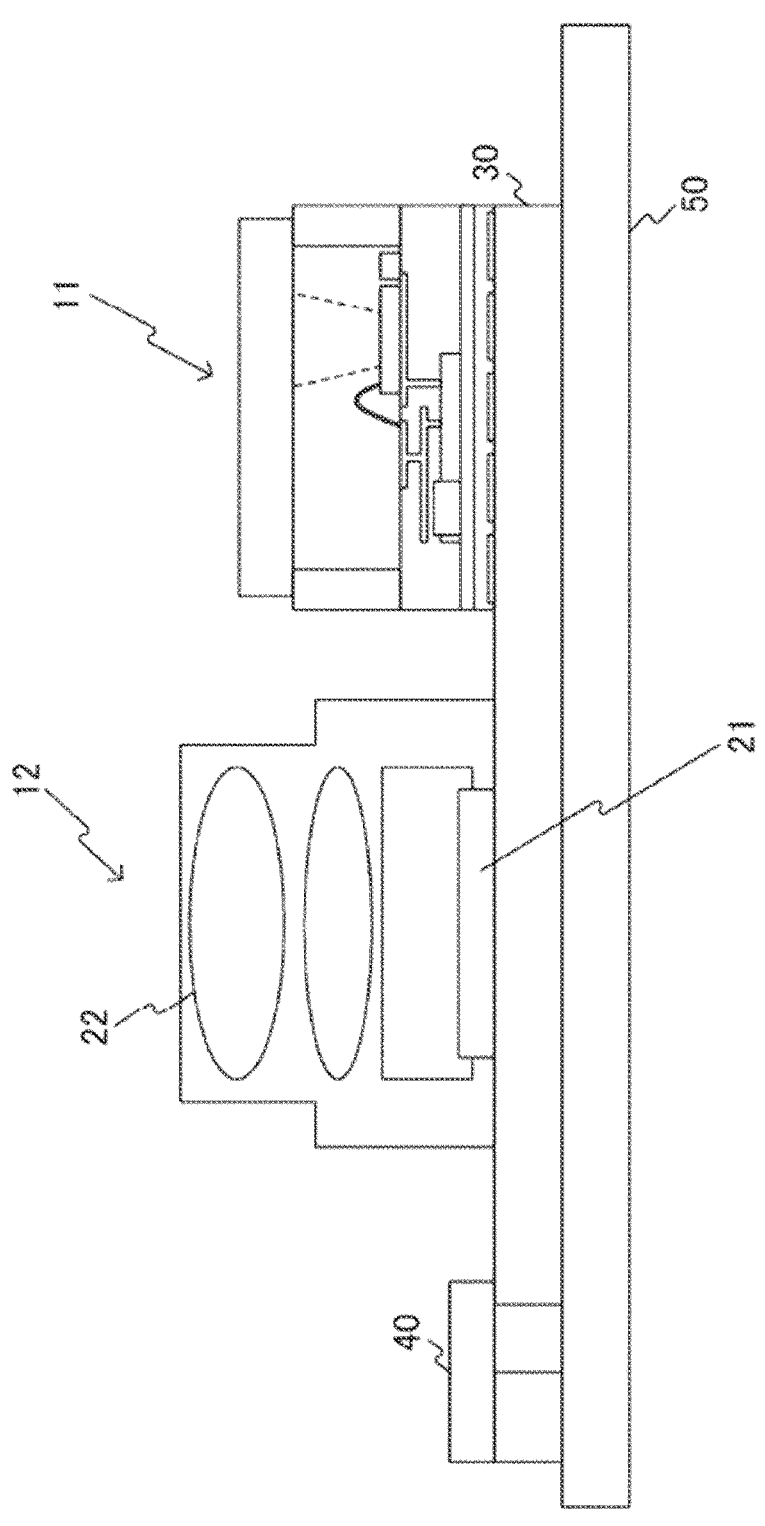
FIG. 2 is a view illustrating an example of a cross-sectional view of the distance measuring module 19 according to the embodiment of the present technology.

FIG. 2 is a view illustrating an example of a cross-sectional view of the distance measuring module 19 according to the embodiment of the present technology.

In this example, an interposer 30 for performing relay to a motherboard 50 is provided on the motherboard 50, and the light-emitting unit 11 and the light-receiving unit 12 are mounted on the interposer 30. A connector 40 is mounted on the interposer 30 and is connected to an external application processor and the like.

The light-receiving unit 12 includes a lens 22 and a sensor 21 for receiving light reflected from the object 20.

"Configuration of light-emitting unit"

Figure 3:
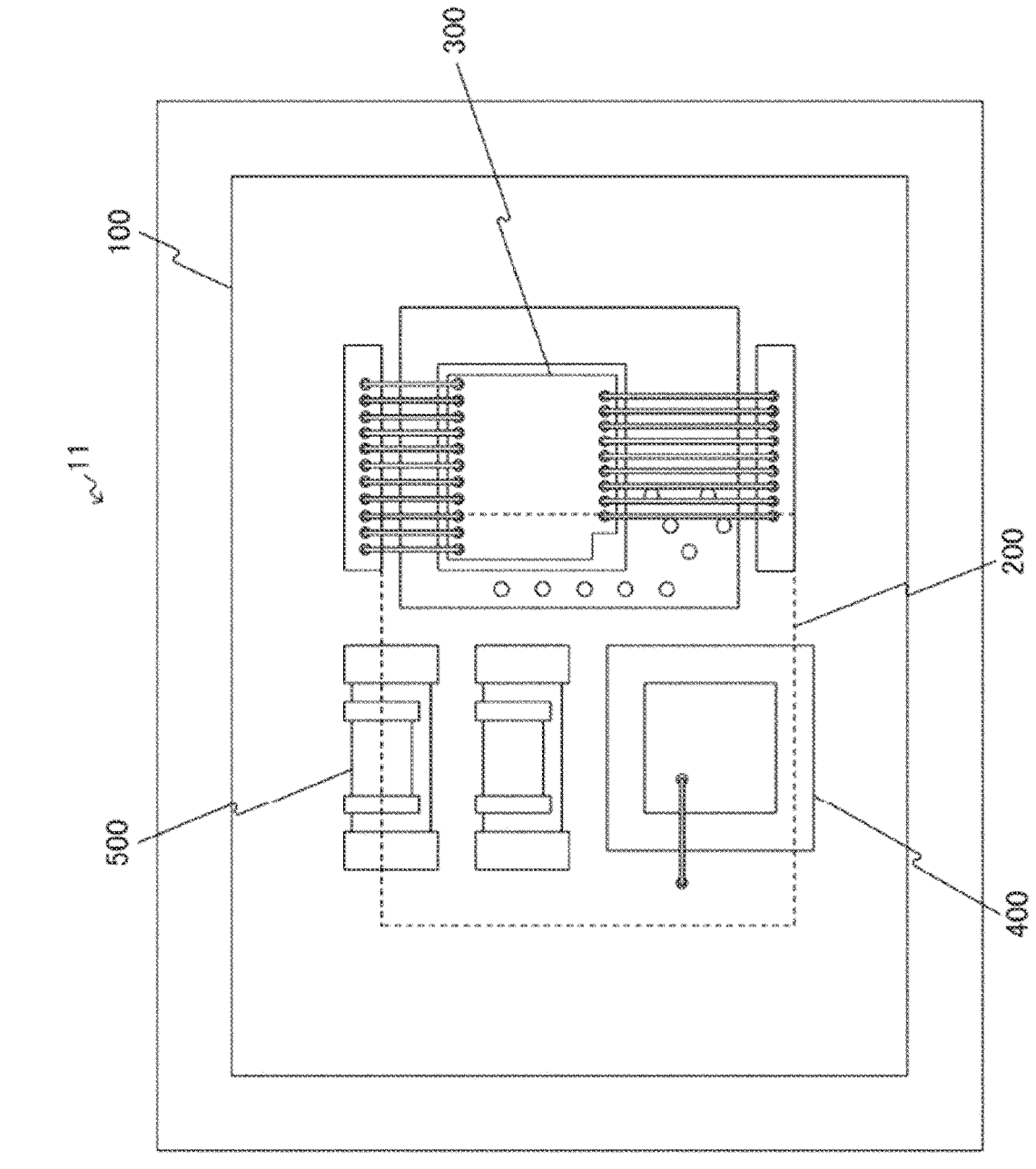
FIG. 3 is a view illustrating an example of a top view of a light-emitting unit 11 according to the embodiment of the present technology.

FIG. 3 is a view illustrating an example of a top view of the light-emitting unit 11 according to the embodiment of the present technology.

This light-emitting unit 11 is assumed to measure the distance by ToF. The ToF has features of having high depth accuracy, although not as high as that of structured light, and being operable without problems even in a dark environment. In addition, the ToF is considered to have many merits as compared to other methods such as the structured light and a stereo camera in terms of simplicity of the device configuration and cost.

In the light-emitting unit 11, a semiconductor laser 300, a photodiode 400, and a passive component 500 are electrically connected and mounted by wire bonding on the surface of the substrate 100 with a laser driver 200 built inside. As the substrate 100, a printed wiring board is assumed.

The semiconductor laser 300 is a semiconductor device that emits laser light by allowing a current to flow through a p-n junction of a compound semiconductor. Specifically, a vertical cavity surface emitting laser (VCSEL) is assumed. In this regard, either a back-emission type or a top-emission type may be used. Here, as the compound semiconductor to be used, for example, aluminum gallium arsenide (AlGaAs), indium gallium arsenide phosphorus (InGaAsP), aluminum gallium indium phosphorus (AlGaInP), gallium nitride (GaN), and the like are assumed.

The laser driver 200 is a driver integrated circuit (IC) for driving the semiconductor laser 300. The laser driver 200 is built in the substrate 100 in a face-up state. As for the electrical connection with the semiconductor laser 300, due to the need for reducing wiring inductance, it is desirable to make the wiring length as short as possible. The specific numerical values thereof will be described later.

The photodiode 400 is a diode for detecting light. The photodiode 400 is used for automatic power control (APC) for monitoring the light intensity of the semiconductor laser 300 and keeping the output of the semiconductor laser 300 constant. As a result, operation within a range that satisfies the laser safety standard can be ensured.

The passive component 500 is a circuit component except for active elements such as a capacitor, an inductor, and a resistor. The passive component 500 includes a de-coupling capacitor for driving the semiconductor laser 300.

Figure 4:
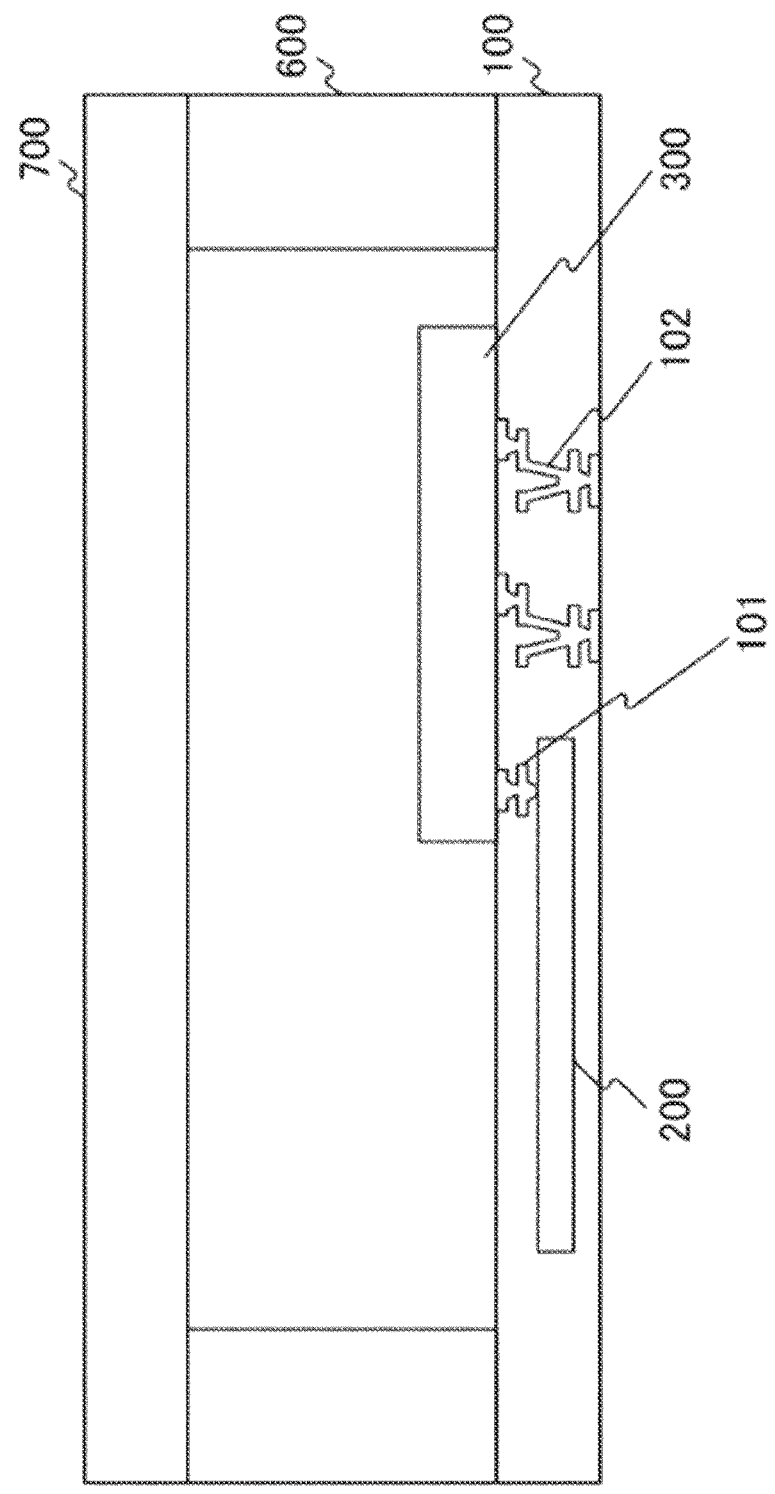
FIG. 4 is a view illustrating an example of a cross-sectional view of the light-emitting unit 11 according to the embodiment of the present technology.

FIG. 4 is a view illustrating an example of a cross-sectional view of the light-emitting unit 11 according to the embodiment of the present technology.

As described above, the substrate 100 has the laser driver 200 built inside and has the semiconductor laser 300 and the like mounted on the surface. The connection between the semiconductor laser 300 and the laser driver 200 is made via a connecting via 101 serving as connection wiring. By using the connecting via 101, the wiring length can be shortened.

Further, the substrate 100 includes a thermal via 102 for heat radiation. Each component mounted on the substrate 100 is a heat source, and by using the thermal via 102, the heat generated in each component can be radiated from the back surface of the substrate 100.

The semiconductor laser 300, the photodiode 400, and the passive component 500 mounted on the surface of the substrate 100 are surrounded by a side wall 600. As a material of the side wall 600, for example, a plastic material or a metal is assumed. Note that the side wall 600 is an example of the outer wall recited in the claims.

The upper surface surrounded by the side wall 600 is covered by a diffuser plate 700.

The diffuser plate 700 is an optical element for diffusing laser light from the semiconductor laser 300 and is also called a diffuser.

Figure 5:
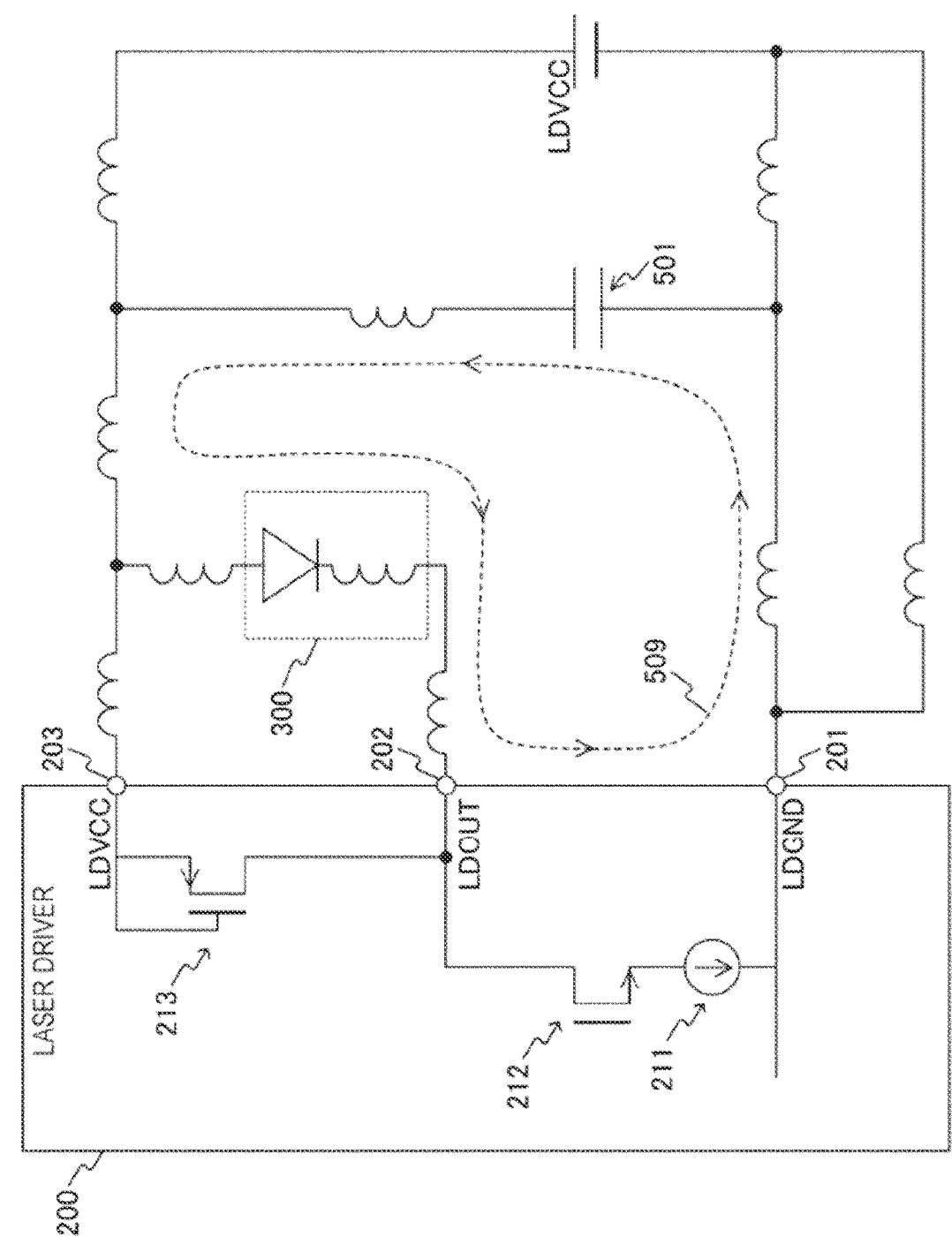
FIG. 5 is a diagram illustrating an example of a circuit configuration of the light-emitting unit 11 according to the embodiment of the present technology.

FIG. 5 is a diagram illustrating an example of a circuit configuration of the light-emitting unit 11 according to the embodiment of the present technology.

As described above, in the light-emitting unit 11, the semiconductor laser 300 is mounted on the surface of the substrate 100, and the laser driver 200 is built inside the substrate 100. The laser driver 200 includes each of the terminals of, for example, an LDGND terminal 201, an LDOUT terminal 202, and an LDVCC terminal 203. The LDGND terminal 201 is a terminal connected to a ground potential. The LDVCC terminal 203 is a terminal connected to a power supply potential. The LDOUT 202 terminal is an output terminal for driving the semiconductor laser 300.

This example illustrates the internal configuration of the last stage of the laser driver 200. A metal oxide semiconductor (MOS) transistor 212 and a current source 211 are connected between the LDOUT 202 terminal and the LDGND terminal 201. By controlling the MOS transistor 212, a current is supplied from the current source 211. Further, a MOS transistor 213 is connected between the LDVCC terminal 203 and the LDOUT 202 terminal. The MOS transistor 213 operates as a load resistor.

The semiconductor laser 300 has an anode connected to the LDVCC terminal 203 and a cathode connected to the LDOUT 202 terminal. Further, a capacitor 501 of the passive component 500 is connected between the LDVCC terminal 203 and the LDGND terminal 201. The capacitor 501 has a low equivalent series inductance (ESL) and functions as a decoupling capacitor to reduce high-frequency noise.

In this circuit example, a path passing through the semiconductor laser 300, the MOS transistor 212, and the capacitor 501 forms a loop 509 as illustrated. The shorter the path of the loop 509, the shorter the wiring length and the lower the impedance. If the impedance decreases, a rise time Tr and a fall time Tf of the laser light emitted from the semiconductor laser 300 can be shortened to increase the speed. In the following, the placement of the capacitor 501 which is the passive component 500 will be considered while the relationship between the semiconductor laser 300 and the laser driver 200 will be described later.

Figure 6:
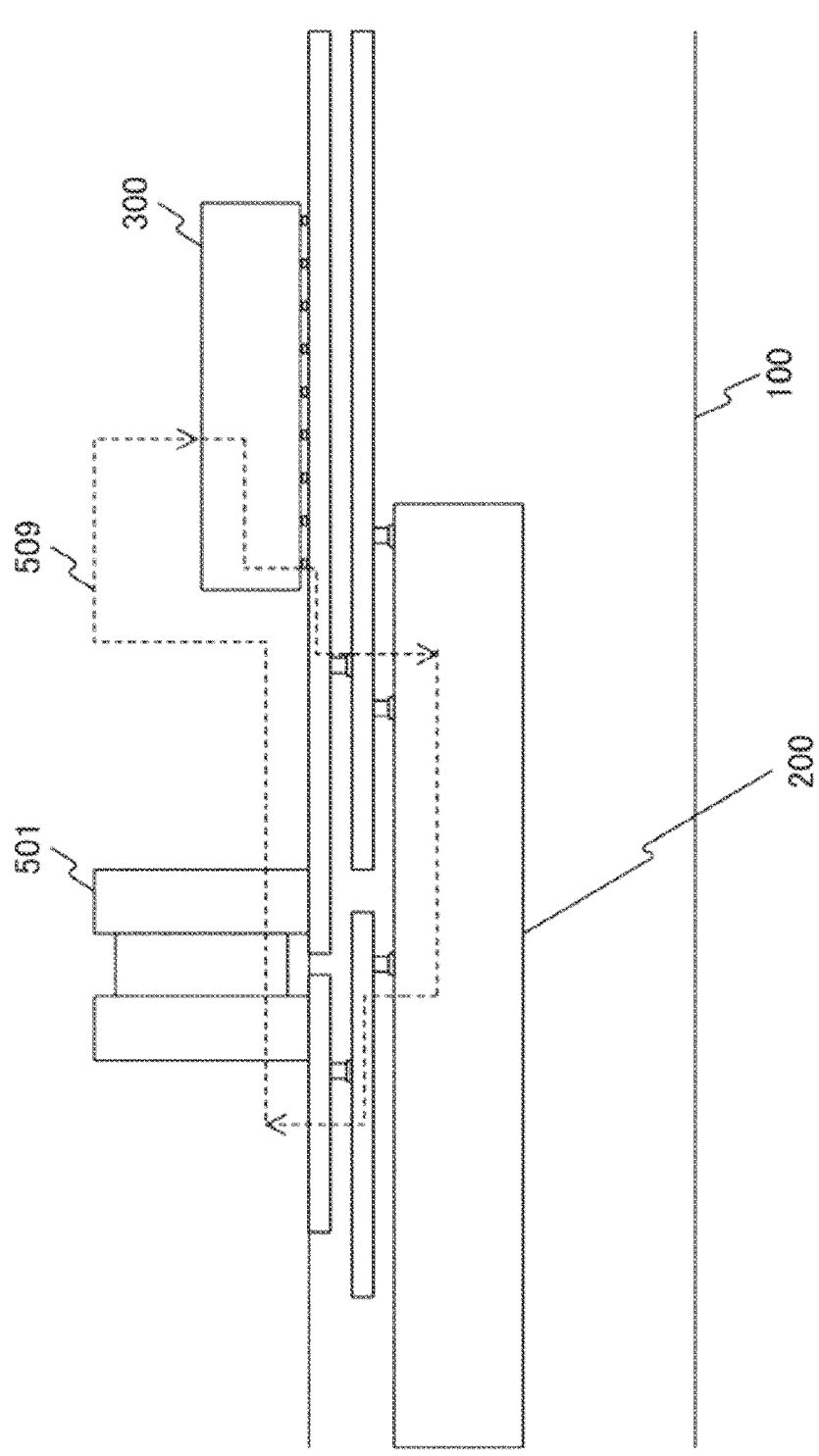
FIG. 6 is a view illustrating an example of a cross-sectional view of a loop 509 portion in the light-emitting unit 11 according to the embodiment of the present technology.

FIG. 6 is a view illustrating an example of a cross-sectional view of the loop 509 portion in the light-emitting unit 11 according to the embodiment of the present technology.

The cathode is connected to the back-surface terminal of the semiconductor laser 300, and the back-surface terminal is electrically connected to the wiring on the surface of the substrate 100. Further, an anode is connected to the surface terminal of the semiconductor laser 300, and the surface terminal is electrically connected to wiring on the surface of the substrate 100 via a bonding wire 302.

As described above, the laser driver 200 connects to the semiconductor laser 300 via the LDVCC terminal 203 and the LDOUT terminal 202, and connects to the capacitor 501 via the LDVCC terminal 203 and the LDGND terminal 201. It is thus understood from this cross-sectional view that the capacitor 501 is desirably disposed at a position near the semiconductor laser 300.

Figure 7A:
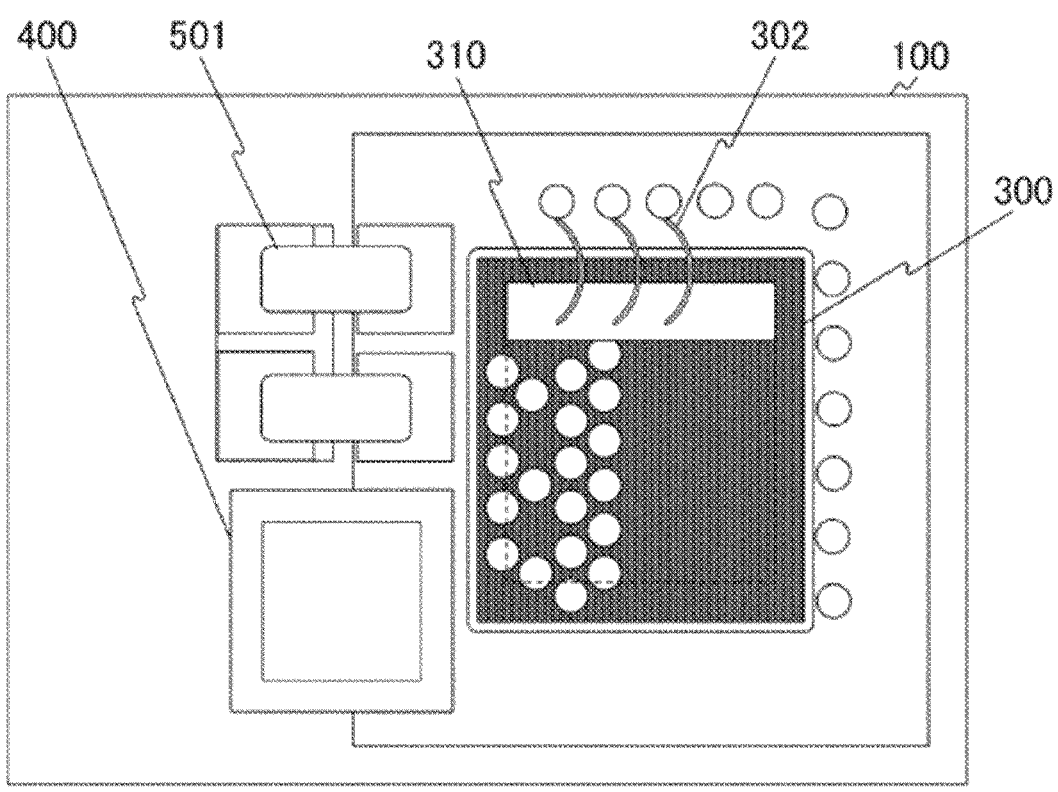
FIG. 7A is a view illustrating an example of a layout of each layer of a substrate 100 according to the embodiment of the present technology.
Figure 7B:
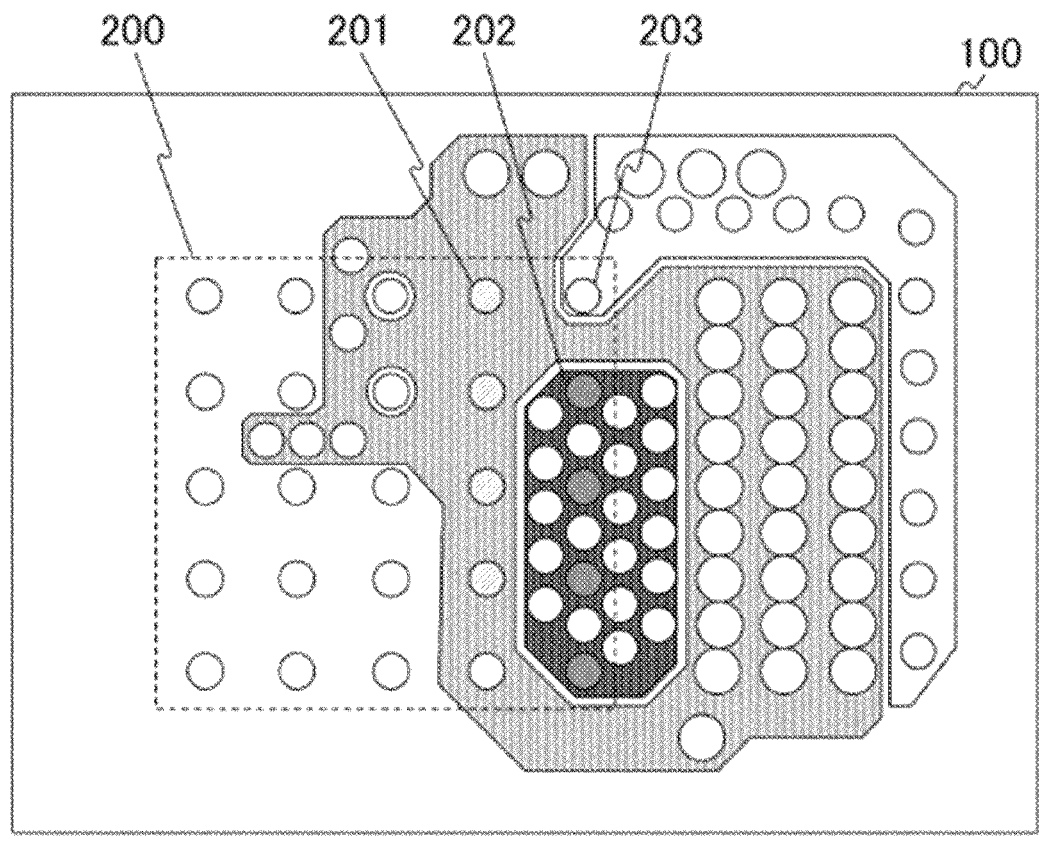
FIG. 7B is a view illustrating an example of a layout of each layer of a substrate 100 according to the embodiment of the present technology.

FIGS. 7A and 7B are views each illustrating an example of a layout of each layer of a substrate 100 according to the embodiment of the present technology.

FIG. 7A illustrates a first layer that is a layer on the surface of the substrate 100. An anode pad 310 of the semiconductor laser 300 mounted on the surface of the substrate 100 is connected to a terminal on the surface of the substrate 100 via a bonding wire 302. It is assumed that the semiconductor laser 300 has more pads in the vertical direction in FIG. 7A. These bonding wires 302 are useful for reducing inductance.

FIG. 7B illustrates a second layer that is a connection layer with the laser driver 200 inside the substrate 100. In this example, it is assumed that four LDGND terminals 201, four LDOUT terminals 202, and one LDVCC terminal 203 are provided as pads of the laser driver 200. The pads of these laser drivers 200 are generally arranged at positions near the semiconductor laser 300. Then, with the LDGND terminal 201 being also connected to the capacitor 501, the LDGND terminal 201 is disposed inside the LDOUT terminal 202.

Figure 8A:
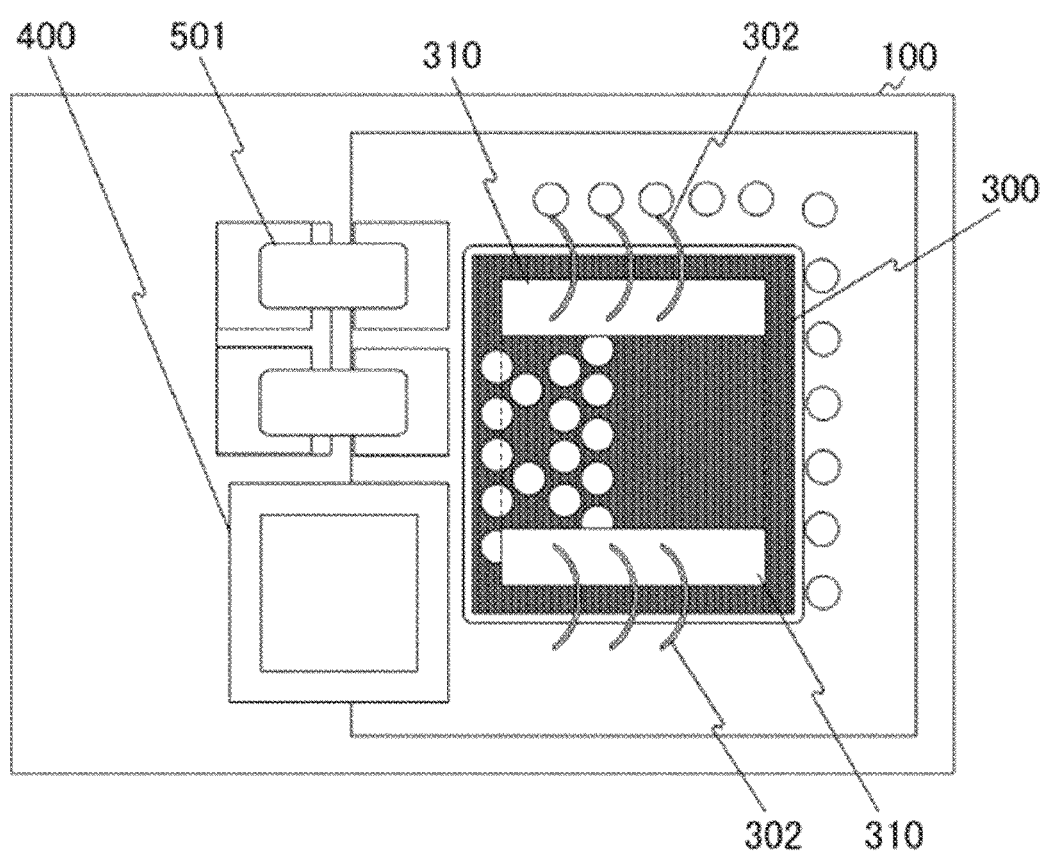
FIG. 8A is a view illustrating another example of the layout of each layer of the substrate 100 according to the embodiment of the present technology.
Figure 8B:
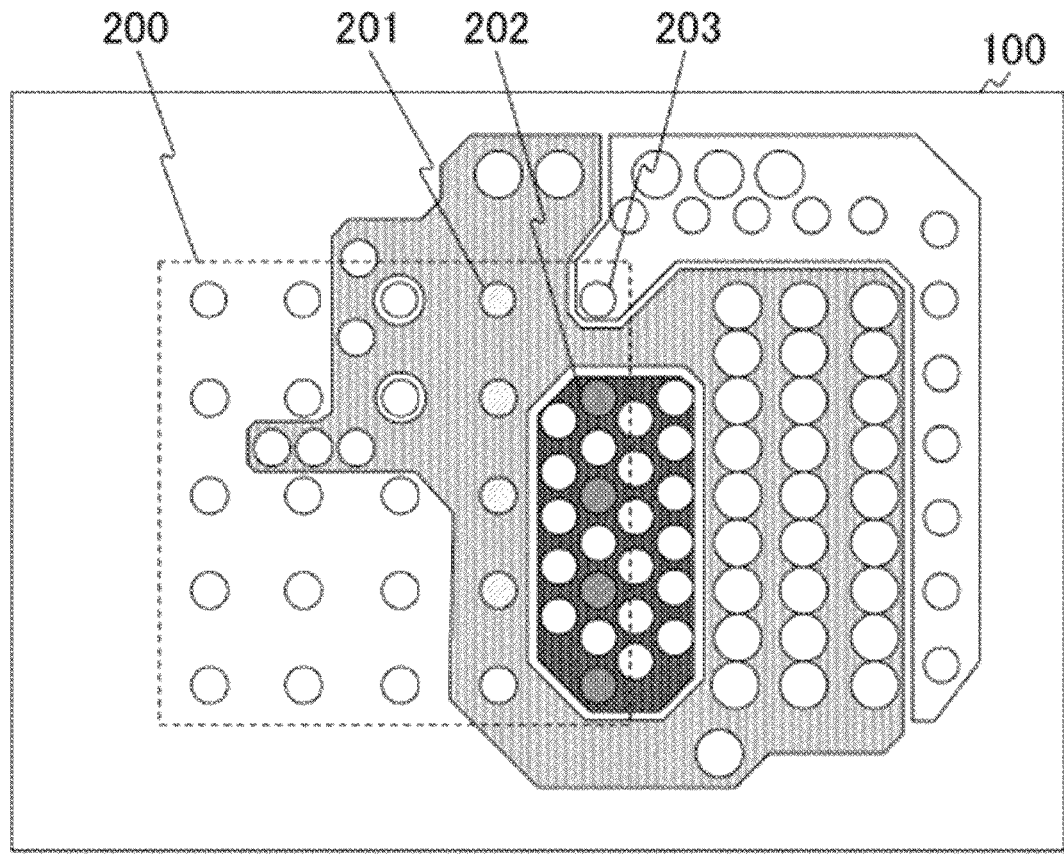
FIG. 8B is a view illustrating another example of the layout of each layer of the substrate 100 according to the embodiment of the present technology.

FIGS. 8A and 8B are views each illustrating another example of the layout of each layer of the substrate 100 according to the embodiment of the present technology.

FIG. 8A illustrates a first layer that is a layer on the surface of the substrate 100. An anode pad 310 of the semiconductor laser 300 mounted on the surface of the substrate 100 is connected to a terminal on the surface of the substrate 100 via a bonding wire 302. The semiconductor laser 300 has pads 310 in two regions (upper and lower in the figure). In a case where the pads 310 are provided above and below, more (e.g., about twice) bonding wires can be arranged as compared to the example of FIGS. 7A and 7B described above. Arranging many bonding wires is useful for reducing the inductance of the bonding wires. In order to reduce the size of the semiconductor laser 300 and to make uniform the distance between each of light emission points of the plurality of VCSELs and the pad 310 in the semiconductor laser 300, and in a case where a plurality of pads is provided in the semiconductor laser 300, the pads are desirably provided so as to face each other as illustrated here. Making uniform the distance between each of the light emission points of the plurality of VCSELs and the pad 310 in the semiconductor laser 300 reduces variation in light emission timing and light emission amount (laser intensity) of each light emission point, and improves the distance measuring accuracy in a case where the distance measuring module 19 measures the distance.

FIG. 8B illustrates a second layer that is a connection layer with the laser driver 200 inside the substrate 100. In this example, it is assumed that four LDGND terminals 201, four LDOUT terminals 202, and one LDVCC terminal 203 are provided as pads of the laser driver 200. The pads of these laser drivers 200 are generally arranged at positions near the semiconductor laser 300. Then, with the LDGND terminal 201 being also connected to the capacitor 501, the LDGND terminal 201 is disposed inside the LDOUT terminal 202.

In consideration of such a pad arrangement, the capacitor 501 is disposed to face the side of the semiconductor laser 300 having the least number of pads. That is, since the semiconductor laser 300 has many pads in the vertical direction, the semiconductor laser 300 is disposed to face the left side having the least number of pads. At this time, considering the connection with the laser driver 200, it is understood that the left side of the semiconductor laser 300 is more suitable for the arrangement of the capacitor 501 than the right side thereof. Therefore, at least a part of the capacitor 501 is desirably disposed on the surface of the substrate 100 to overlap the laser driver 200 thereabove.

Further, the placement of the photodiode 400 will also be considered. A part of the laser light output from the semiconductor laser 300 is reflected on the diffuser plate 700 in accordance with the reflectance of the diffuser plate 700, and enters the photodiode 400. The laser power P2 of the reflected light having entered the photodiode 400 is proportional to laser power P1 output from the semiconductor laser 300 if the surrounding environment is the same. That is, a reflection ratio "P2/P1" indicates a constant value if the surrounding environment is the same. In other words, in a case where the reflection ratio "P2/P1" changes, it indicates that the surrounding environment has changed due to some factor. For example, in a case where the diffuser plate 700 is damaged, the ratio of the reflected light entering the photodiode 400 is reduced greatly. Further, in the long term, in a case where the semiconductor laser 300 gradually deteriorates and the laser power P1 expected by the laser driver 200 has not been output from the semiconductor laser 300, a light amount Pv of the photodiode 400 decreases, and "P1/Pv" becomes higher than a reference value. For example, in a case where "P1/Pv" is 1.1 times the reference value, the laser driver 200 increases a requirement value of the laser power in the semiconductor laser 300 by 10% in response to the temperature of the semiconductor laser 300, and supplies a drive current. As described above, the photodiode 400 receives the light output from the semiconductor laser 300 and reflected by the diffuser plate 700. Thus, in order to ensure the amount of light incident on the photodiode 400, the photodiode 400 is desirably disposed near the semiconductor laser 300. Therefore, in consideration of the arrangement of the pads of the semiconductor laser 300, the photodiode 400 is disposed to face the side of the semiconductor laser 300 having the least number of pads.

Figure 9A:
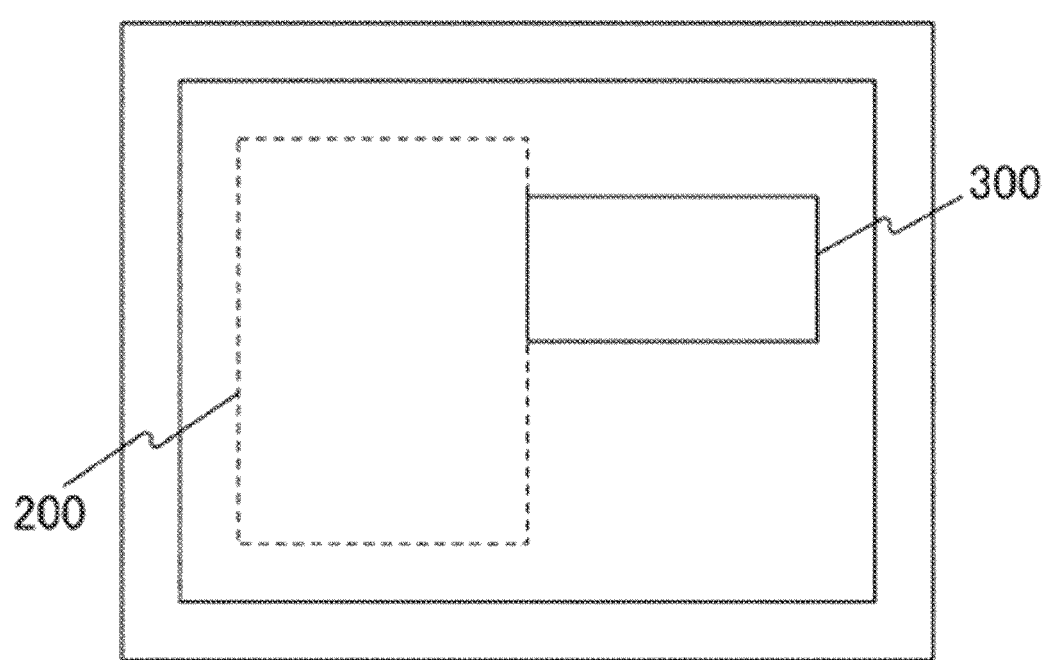
FIG. 9A is a view illustrating a definition of the amount of overlap between a laser driver 200 and a semiconductor laser 300 according to the embodiment of the present technology.
Figure 9B:
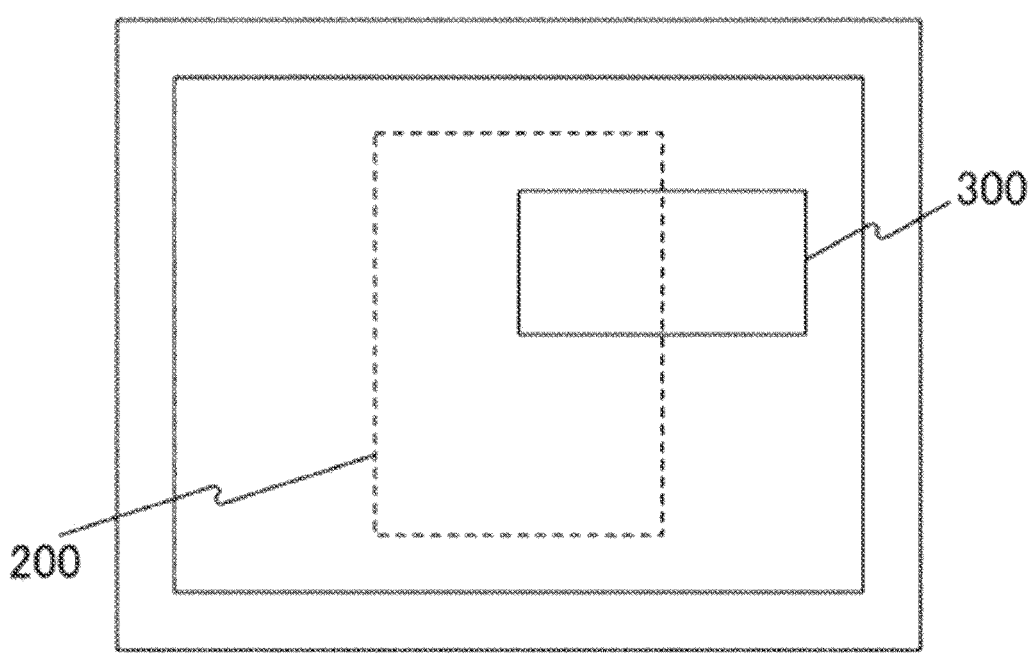
FIG. 9B is a view illustrating a definition of the amount of overlap between a laser driver 200 and a semiconductor laser 300 according to the embodiment of the present technology.
Figure 9C:
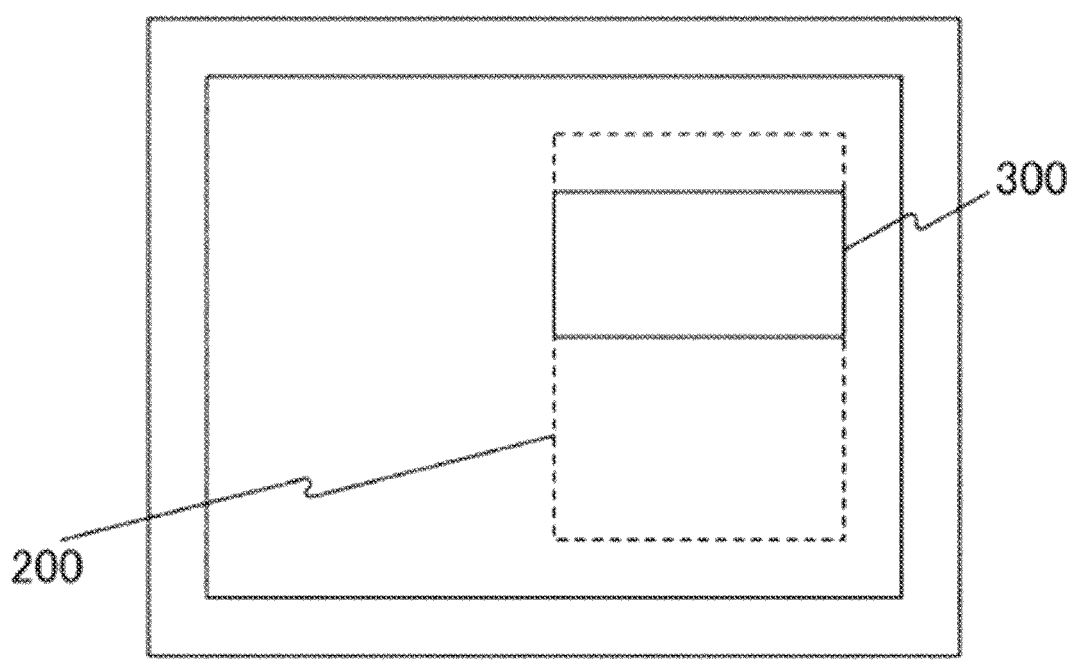
FIG. 9C is a view illustrating a definition of the amount of overlap between a laser driver 200 and a semiconductor laser 300 according to the embodiment of the present technology.

FIGS. 9A to 9C are views each illustrating a definition of the amount of overlap between the laser driver 200 and the semiconductor laser 300 according to the embodiment of the present technology.

As described above, since the connection between the semiconductor laser 300 and the laser driver 200 is assumed to be made via the connecting via 101, the semiconductor laser 300 and the laser driver 200 are disposed to overlap as viewed from the top. On the other hand, the thermal via 102 is desirably provided on the lower surface of the semiconductor laser 300, and a region for that needs to be ensured. Therefore, in order to clarify the positional relationship between the laser driver 200 and the semiconductor laser 300, the amount of overlap therebetween is defined as follows.

In the placement illustrated in FIG. 9A, there is no overlapping region in the laser driver 200 or the semiconductor laser 300 as viewed from above. The amount of overlap in this case is defined as 0%. On the other hand, in the placement illustrated in FIGS. 9C, the entire semiconductor laser 300 overlaps the laser driver 200 as viewed from above. The amount of overlap in this case is defined as 100%.

Then, in the placement illustrated in FIGS. 9B, a half region of the semiconductor laser 300 as viewed from above overlaps the laser driver 200. The amount of overlap in this case is defined as 50%.

In the present embodiment, in order to provide a region for the connecting via 101 described above, the amount of overlap is desirably larger than 0%. On the other hand, considering that a certain number of thermal vias 102 are arranged immediately below the semiconductor laser 300, the amount of overlap is desirably 50% or less. Therefore, by setting the amount of overlap to be more than 0% and 50% or less, it is possible to reduce wiring inductance and obtain favorable heat radiation characteristics.

"Wiring inductance"

As described above, in the connection between the semiconductor laser 300 and the laser driver 200, the wiring inductance is problematic. All conductors have inductive components, and in a high-frequency region such as the ToF system, the inductance of even a very short lead can have an adverse effect. That is, at the time of high-frequency operation, a drive waveform for driving the semiconductor laser 300 from the laser driver 200 may be distorted due to the influence of the wiring inductance, and the operation may be unstable.

Here, a theoretical formula for calculating the wiring inductance will be considered. For example, an inductance IDC [μH] of a linear lead having a circular section with a length L [mm] and a radius R [mm] is expressed by the following equation in free space. Here, In represents a natural logarithm.

$$IDC = 0.0002L \cdot (\ln(2L/R) - 0.75)$$

Further, for example, the inductance IDC [μH] of a strip line (substrate wiring pattern) having a length L [mm], a width W [mm], and a thickness H [mm] is expressed by the following equation in free space.

$$IDC = 0.0002L \cdot (1n(2L/(W+H)) + 0.2235((W+H)/L) + 0.5)$$

FIGS. 10 and 11 illustrate a trial calculation of the wiring inductance [nH] between the laser driver built inside the printed wiring board and the semiconductor laser electrically connected to the upper part of the printed wiring board.

FIG. 10 is a diagram illustrating a numerical example of a wiring inductance with respect to a wiring length L and a wiring width W in a case where a wiring pattern is formed by an additive method. The additive method is a method of forming a pattern by depositing copper only on a necessary portion of an insulating resin surface.

FIG. 11 is a diagram illustrating a numerical example of the wiring inductance with respect to the wiring length L and the wiring width W in a case where a wiring pattern is formed by a subtractive method. The subtractive method is a method of forming a pattern by etching an unnecessary portion of the copper clad laminate.

In the case of the distance measuring module such as the ToF system, assuming that the module is driven at several hundred megahertz, the wiring inductance is desirably 0.5 nH or less, and more preferably 0.3 nH or less. Therefore, in consideration of the calculation results described above, it is considered that the wiring length between the semiconductor laser 300 and the laser driver 200 is desirably 0.5 mm or less, and more preferably 0.3 mm or less.

"Manufacturing method"

FIGS. 12A to 12C and FIGS. 13D to 13F are views each illustrating an example of a step of processing a copper land and a copper wiring layer (redistribution layer: RDL) in the manufacturing process of the laser driver 200 according to the embodiment of the present technology.

Figure 12A:
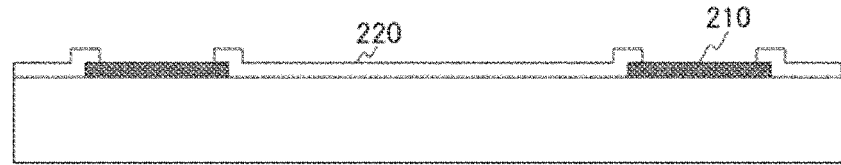
FIG. 12A is a first view illustrating an example of a step of processing a copper land and a copper wiring layer (redistribution layer: RDL) in the manufacturing process of the laser driver 200 according to the embodiment of the present technology.

First, as illustrated in FIG. 12A, an input/output (I/O) pad 210 including, for example, aluminum or the like is formed on a semiconductor wafer. Then, a protective insulation layer 220 such as SiN is formed on the surface, and a region of the I/O pad 210 is opened.

Figure 12B:
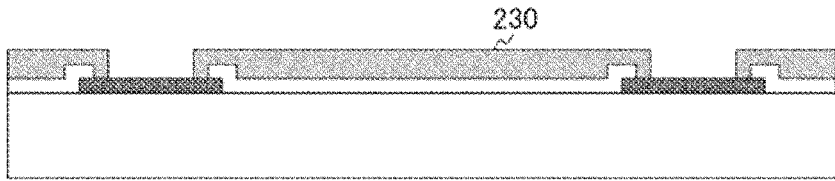
FIG. 12B is a first view illustrating an example of a step of processing a copper land and a copper wiring layer (redistribution layer: RDL) in the manufacturing process of the laser driver 200 according to the embodiment of the present technology.

Next, as illustrated in FIG. 12B, a surface protection film 230 including polyimide (PI) or polybenzoxazole (PBO) is formed, and a region of the I/O pad 210 is opened.

Figure 12C:
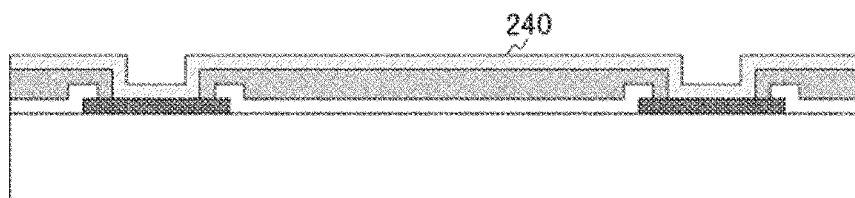
FIG. 12C is a first view illustrating an example of a step of processing a copper land and a copper wiring layer (redistribution layer: RDL) in the manufacturing process of the laser driver 200 according to the embodiment of the present technology.

Next, as illustrated in FIG. 12C, titanium tungsten (TiW) of about several tens to hundreds of nm and copper (Cu) of about one hundred to thousand nm are continuously sputtered to form an adhesion layer—seed layer 240. Here, a high melting point metal such as chromium (Cr), nickel (Ni), titanium (Ti), titanium copper (TiCu), or platinum (Pt), or an alloy thereof may be applied to the adhesion layer in addition to titanium tungsten (TiW). Further, nickel (Ni), silver (Ag), gold (Au), or an alloy thereof may be applied to the seed layer in addition to copper (Cu).

Figure 13D:
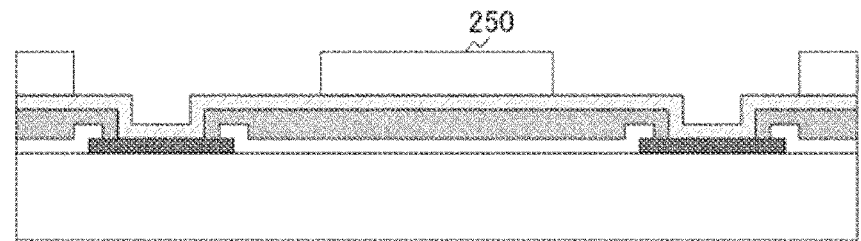
FIG. 13D is a second view illustrating an example of the step of processing the copper land and the copper wiring layer (RDL) in the manufacturing process of the laser driver 200 according to the embodiment of the present technology.

Next, as illustrated in in FIG. 13D, a photoresist 250 is patterned in order to form a copper land and a copper wiring layer for electrical bonding. Specifically, the formation is performed by each of the steps of surface cleaning, resist coating, drying, exposure, and development.

Figure 13E:
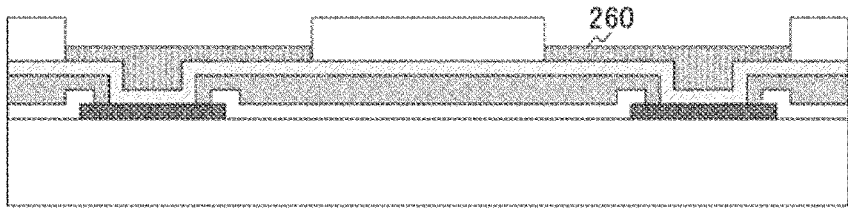
FIG. 13E is a second view illustrating an example of the step of processing the copper land and the copper wiring layer (RDL) in the manufacturing process of the laser driver 200 according to the embodiment of the present technology.

Next, as illustrated in FIG. 13E, a copper land—copper wiring layer (RDL) 260 for electrical bonding is formed on the adhesion layer—seed layer 240 by a plating method. Here, as the plating method, for example, an electrolytic copper plating method, an electrolytic nickel plating method, or the like can be used. Further, it is desirable that the diameter of the copper land be about 50 to 100 μm, the thickness of the copper wiring layer be about 3 to 10 μm, and the minimum width of the copper wiring layer be about 10 μm.

Figure 13F:
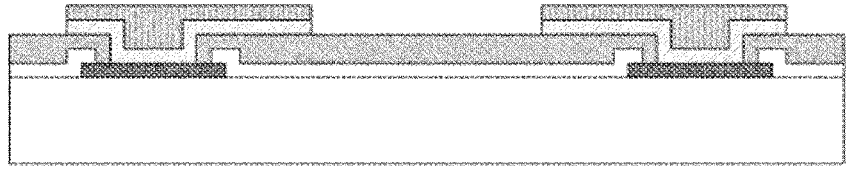
FIG. 13F is a second view illustrating an example of the step of processing the copper land and the copper wiring layer (RDL) in the manufacturing process of the laser driver 200 according to the embodiment of the present technology.

Next, as illustrated in FIG. 13F, the photoresist 250 is removed, and copper land—copper wiring layer (RDL) 260 of a semiconductor chip is masked, and dry etching is performed. Here, as the dry etching, for example, ion milling for performing irradiation with an argon ion beam can be used. By the dry etching, the adhesion layer—seed layer 240 in the unnecessary region can be selectively removed, and the copper land and the copper wiring layer are separated from each other. Note that although the removal of the unnecessary region can be performed by wet etching with aqua regia, an aqueous solution of ceric ammonium nitrate or potassium hydroxide, or the like, dry etching is more desirable considering the side etching and thickness reduction of the metal layer constituting the copper land and the copper wiring layer.

FIG. 14A to FIG. 18P are views each illustrating an example of the manufacturing process of the substrate 100 according to the embodiment of the present technology.

Figure 14A:
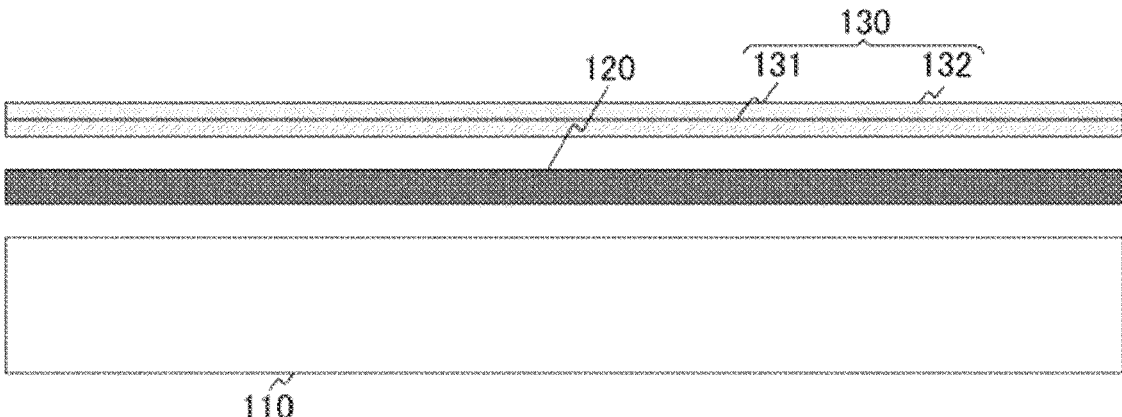
FIG. 14A is a first view illustrating an example of a manufacturing process of the substrate 100 according to the embodiment of the present technology.

First, as illustrated in FIG. 14A, a peelable copper foil 130 having a two-layer structure of an ultra-thin copper foil 132 and a carrier copper foil 131 is thermocompression-bonded on one side of the support plate 110 by roll lamination or lamination press via an adhesive resin layer 120.

As the support plate 110, a substrate including an inorganic material, a metal material, a resin material, or the like can be used. For example, silicon (Si), glass, ceramic, copper, copper-based alloy, aluminum, aluminum alloy, stainless steel, polyimide resin, and epoxy resin can be used.

As the peelable copper foil 130, one formed by vacuum adhesion of the carrier copper foil 131 having a thickness of 18 to 35 μm to the ultra-thin copper foil 132 having a thickness of 2 to 5 μm is used. As the peelable copper foil 130, for example, 3FD-P3/35 (manufactured by Furukawa Circuit Foil Co., Ltd.), MT-18S5DH (manufactured by Mitsui Mining & Smelting Co., Ltd.), or the like can be used.

As a resin material of the adhesive resin layer 120, it is possible to use an organic resin containing a glass fiber reinforcing material, such as epoxy resin, polyimide resin, polyphenyleneether (PPE) resin, phenol resin, polytetrafluoroethylene (PTFE) resin, silicon resin, polybutadiene resin, polyester resin, melamine resin, urea resin, polyphenylenesulfide (PPS) resin, or polyphenylene oxide (PPO) resin. Further, as the reinforcing material, an aramid nonwoven fabric, an aramid fiber, a polyester fiber, or the like can also be used in addition to the glass fiber.

Figure 14B:
FIG. 14B is a first view illustrating an example of a manufacturing process of the substrate 100 according to the embodiment of the present technology.

Next, as illustrated in FIG. 14B, a plating underlying conductive layer (not illustrated) having a thickness of 0.5 to 3 μm is formed on the surface of the ultra-thin copper foil 132 of the peelable copper foil 130 by electroless copper plating processing. Note that this electroless copper plating processing forms a conductive layer as a base of electrolytic copper plating for forming a wiring pattern in the next step. However, this electroless copper plating processing may be omitted, and the wiring pattern may be formed by bringing an electrode for electrolytic copper plating into direct contact with the peelable copper foil 130 to perform electrolytic copper plating processing directly on the peelable copper foil 130.

Figure 14C:
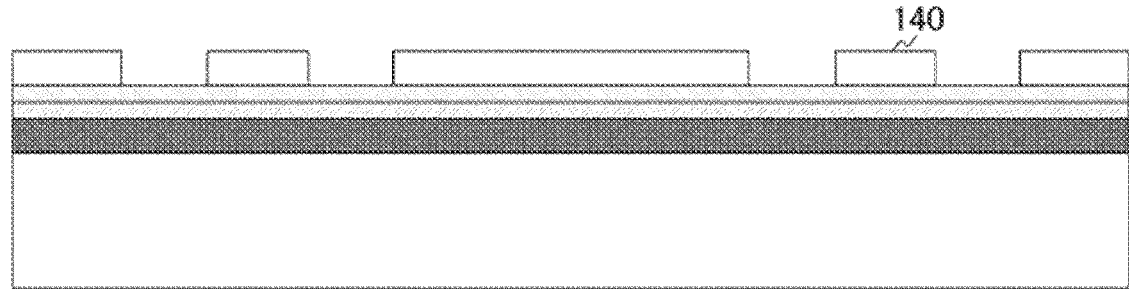
FIG. 14C is a first view illustrating an example of a manufacturing process of the substrate 100 according to the embodiment of the present technology.

Next, as illustrated in FIG. 14C, a photosensitive resist is attached to the surface of the support plate by roll lamination to form a resist pattern (solder resist 140) for the wiring pattern. As the photosensitive resist, for example, a plating resist of a dry film can be used.

Figure 14D:
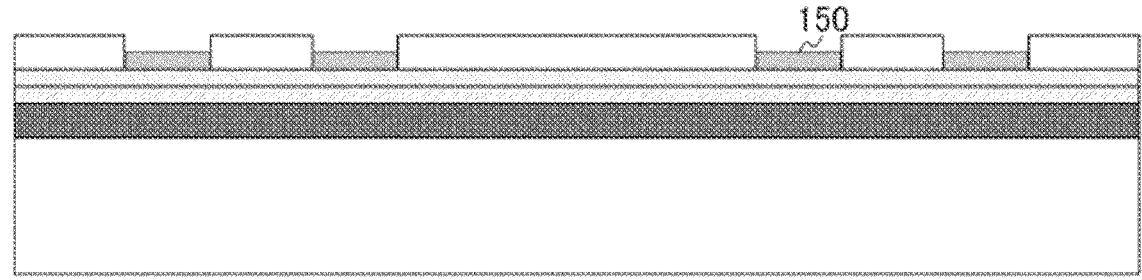
FIG. 14D is a first view illustrating an example of a manufacturing process of the substrate 100 according to the embodiment of the present technology.

Next, as illustrated in FIG. 14D, a wiring pattern 150 having a thickness of about 15 μm is formed by the electrolytic copper plating processing.

Figure 15E:
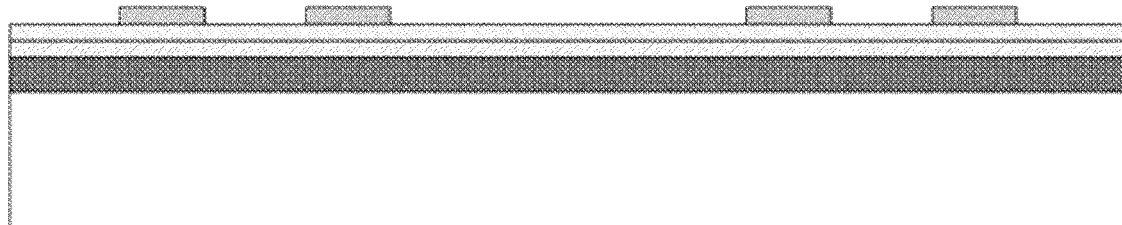
FIG. 15E is a second view illustrating an example of the manufacturing process of the substrate 100 according to the embodiment of the present technology.

Next, as illustrated in FIG. 15E, the plating resist is peeled off. Then, as a pre-treatment for forming an interlayer insulating resin, the surface of the wiring pattern is subjected to roughening treatment to improve the adhesion between the interlayer insulating resin and the wiring pattern. Note that the roughening treatment can be performed by blackening treatment using an oxidation-reduction treatment or soft etching treatment of a persulfuric acid system.

Figure 15F:
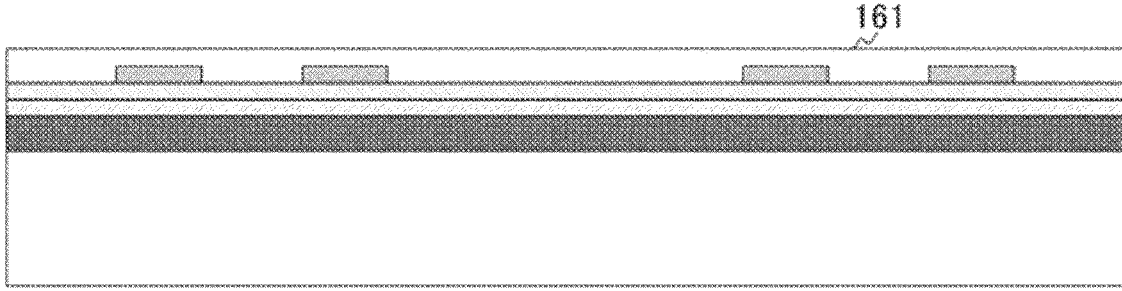
FIG. 15F is a second view illustrating an example of the manufacturing process of the substrate 100 according to the embodiment of the present technology.

Next, as illustrated in FIG. 15F, an interlayer insulating resin 161 is thermocompression-bonded on the wiring pattern by roll lamination or lamination press. For example, an epoxy resin having a thickness of 45 μm is roll-laminated. In the case of using a glass epoxy resin, copper foils with a freely selected thickness are stacked and thermocompression-bonded by lamination press. As a resin material of the interlayer insulating resin 161, it is possible to use an organic resin such as epoxy resin, polyimide resin, PPE resin, phenol resin, PTFE resin, silicon resin, polybutadiene resin, polyester resin, melamine resin, urea resin, PPS resin, or PPO resin. In addition, these resins may be used alone or a combination of resins, obtained by mixing a plurality of resins or forming a compound, may be used. Moreover, an interlayer insulating resin in which an inorganic filler is contained in these materials or a glass fiber reinforcing material is mixed can also be used.

Figure 15G:
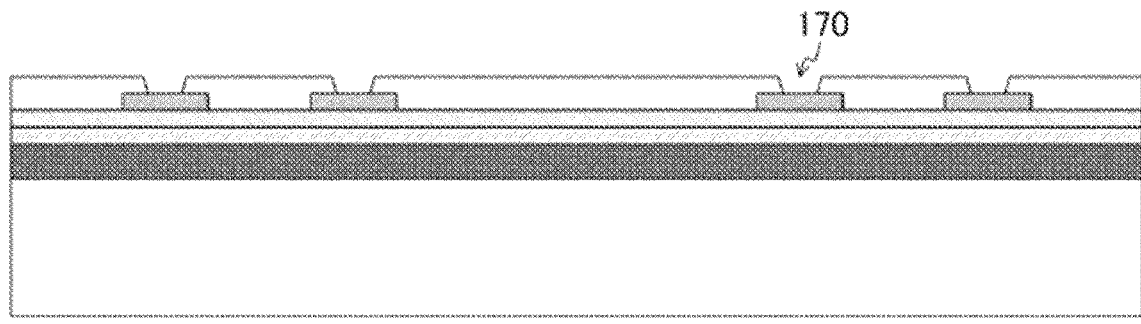
FIG. 15G is a second view illustrating an example of the manufacturing process of the substrate 100 according to the embodiment of the present technology.

Next, as illustrated in FIG. 15G, a via hole for interlayer electrical connection is formed by a laser method or a photoetching method. In a case where the interlayer insulating resin 161 is a thermosetting resin, the via hole is formed by the laser method. As the laser light, an ultraviolet laser, such as a harmonic yttrium aluminum garnet (YAG) laser or an excimer laser, or an infrared laser, such as a carbon dioxide gas laser, can be used. Note that in a case where a via hole is formed by laser light, a thin resin film may remain on the bottom of the via hole, and hence desmearing treatment is performed. In this desmearing treatment, a resin is swollen by a strong alkali, and the resin is decomposed and removed using an oxidizing agent such as chromic acid or a permanganate aqueous solution. Further, the resin can also be removed by plasma treatment or sandblasting treatment with an abrasive. In a case where the interlayer insulating resin 161 is a photosensitive resin, a via hole 170 is formed by the photoetching method. That is, the via hole 170 is formed by performing exposure using ultraviolet light through a mask and then developing.

Figure 15H:
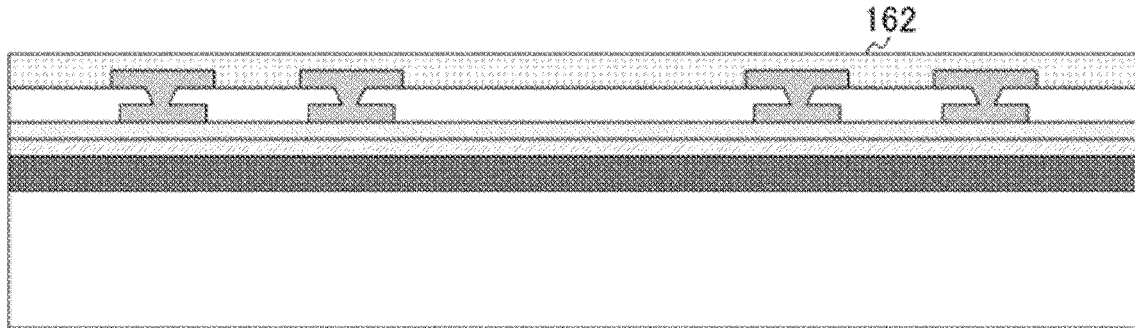
FIG. 15H is a second view illustrating an example of the manufacturing process of the substrate 100 according to the embodiment of the present technology.

Next, after the roughening treatment, the electroless plating processing is performed on the wall surface of the via hole 170 and the surface of the interlayer insulating resin 161. Next, a photosensitive resist is attached by roll lamination to the surface of the interlayer insulating resin 161 with its surface subjected to the electroless plating processing. As the photosensitive resist in this case, for example, a photosensitive plating resist film of a dry film can be used. The photosensitive plating resist film is exposed and then developed to form a plating resist pattern in which a portion for the via hole 170 and a portion for the wiring pattern are opened. Next, the opening portion of the plating resist pattern is subjected to the electrolytic copper plating processing with a thickness of 15 μm. Then, by peeling off the plating resist and removing the electroless plating remaining on the interlayer insulating resin by flash etching of a persulfuric acid system or the like, a via hole 170 filled with copper plating and a wiring pattern as illustrated in FIG. 15H are formed. Then, the similar roughening step for the wiring pattern and the similar formation step for an interlayer insulating resin 162 are performed repeatedly.

Figure 16I:
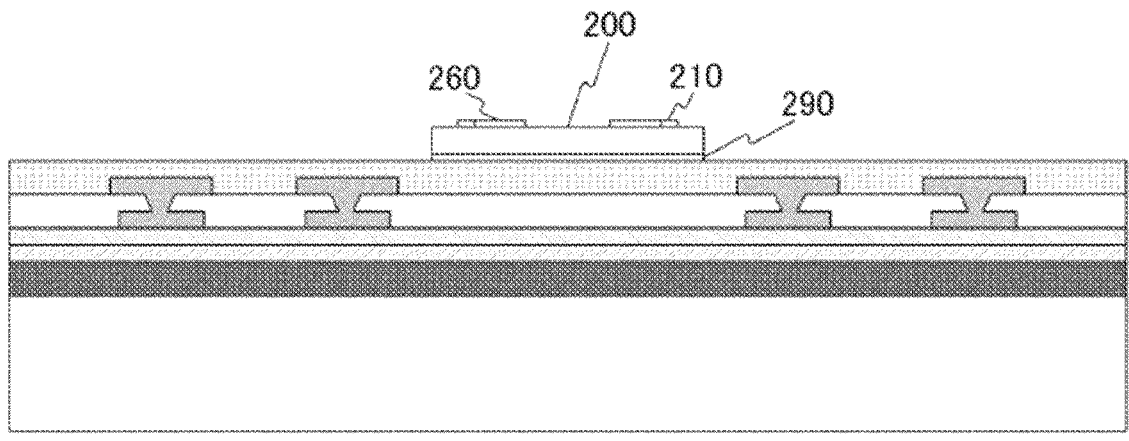
FIG. 16I is a third view illustrating an example of the manufacturing process of the substrate 100 according to the embodiment of the present technology.

Next, as illustrated in FIG. 16I, the laser driver 200 with a die attach film (DAF) 290 having a processed copper land and copper wiring layer thinned to a thickness of about 30 to 50 μm is mounted in a face-up state.

Figure 16J:
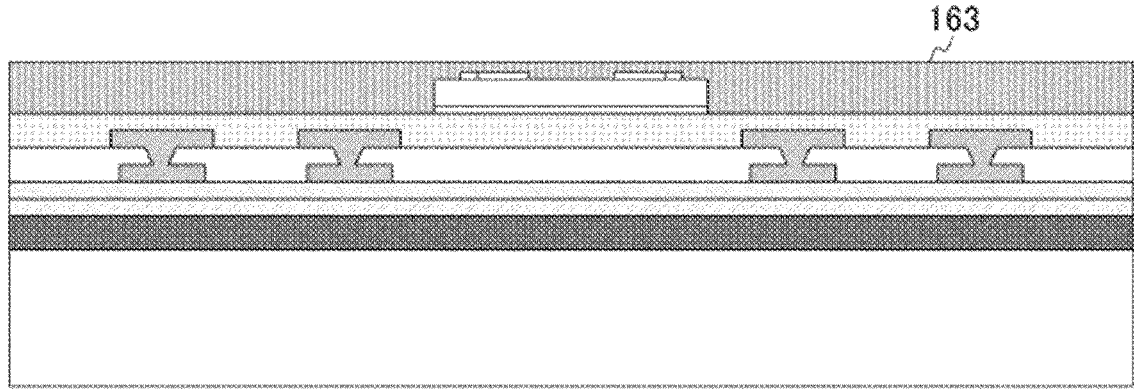
FIG. 16J is a third view illustrating an example of the manufacturing process of the substrate 100 according to the embodiment of the present technology.

Next, as illustrated in FIG. 16J, an interlayer insulating resin 163 is thermocompression-bonded by roll lamination or lamination press.

Figure 16K:
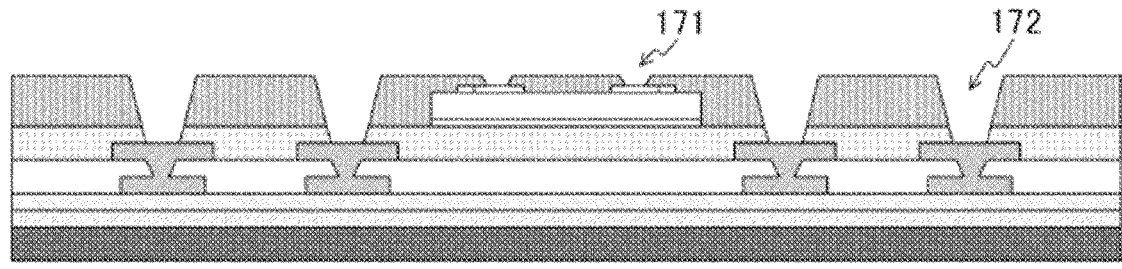
FIG. 16K is a third view illustrating an example of the manufacturing process of the substrate 100 according to the embodiment of the present technology.
Figure 17L:
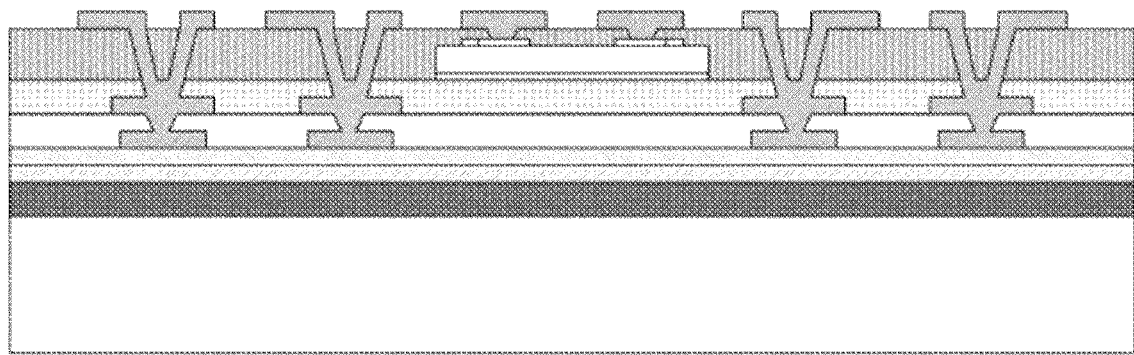
FIG. 17L is a fourth view illustrating an example of the manufacturing process of the substrate 100 according to the embodiment of the present technology.

Next, as illustrated in FIG. 16K and FIG. 17L, the via hole processing, the desmearing treatment, the roughening treatment, the electroless plating processing, and the electrolytic plating processing which are similar to those performed until then are performed. Note that the processing of a shallow via hole 171 in the copper land of the laser driver 200, the processing of a deep via hole 172 one level lower, the desmearing treatment, and the roughening treatment are performed simultaneously.

Here, the shallow via hole 171 is a filled via filled with copper plating. The size and depth of the via are each about 20 to 30 μm. Further, the size of the land is about 60 to 80 μm in diameter.

On the other hand, the deep via hole 172 is a so-called conformal via in which copper is plated only on the outside of the via. The size and depth of the via are each about 80 to 150 μm. The size of the land is about 150 to 200 μm in diameter. Note that the deep via hole 172 is desirably disposed via an insulating resin of about 100 μm from the outer shape of the laser driver 200.

Figure 17M:
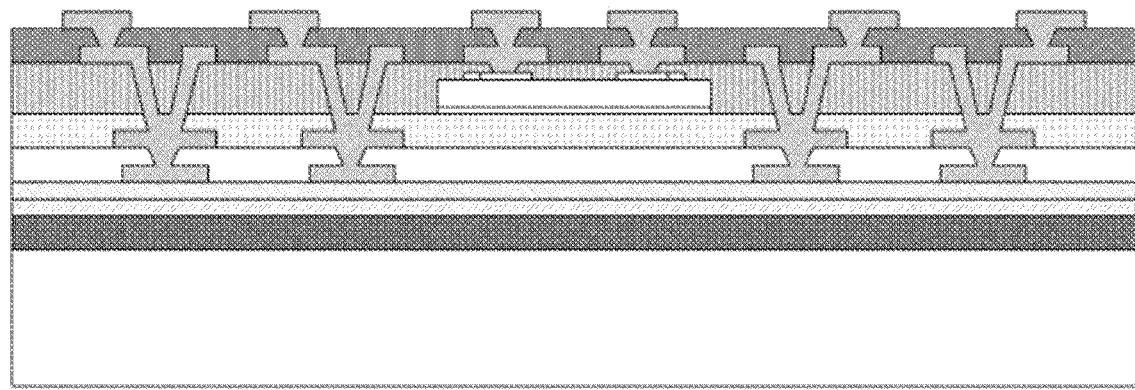
FIG. 17M is a fourth view illustrating an example of the manufacturing process of the substrate 100 according to the embodiment of the present technology.

Next, as illustrated in FIG. 17M, an interlayer insulating resin similar to that used until then is thermocompression-bonded by roll lamination or lamination press. At this time, the inside of the conformal via is filled with an interlayer insulating resin. Next, the via hole processing, the desmearing treatment, the roughening treatment, the electroless plating processing, and the electrolytic plating processing which are similar to those performed until then are performed.

Figure 17N:
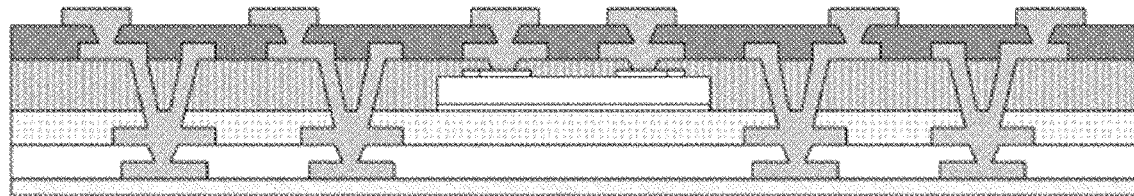
FIG. 17N is a fourth view illustrating an example of the manufacturing process of the substrate 100 according to the embodiment of the present technology.

Next, as illustrated in in FIG. 17N, the support plate 110 is separated by peeling off the interface between the carrier copper foil 131 and the ultra-thin copper foil 132 of the peelable copper foil 130.

Figure 18O:
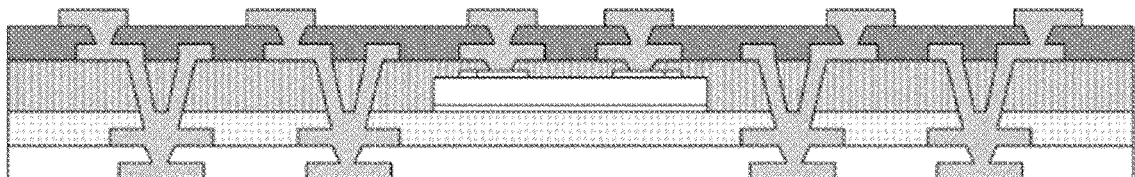
FIG. 18O is a fifth view illustrating an example of the manufacturing process of the substrate 100 according to the embodiment of the present technology.
Figure 18P:
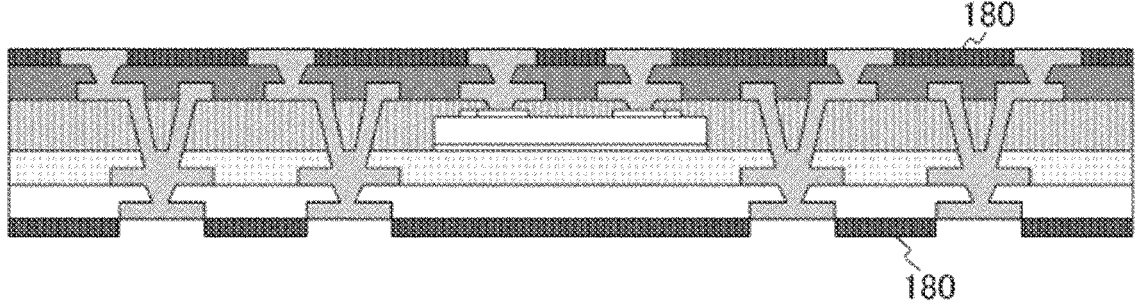
FIG. 18P is a fifth view illustrating an example of the manufacturing process of the substrate 100 according to the embodiment of the present technology.

Next, as illustrated in FIG. 18O, the ultra-thin copper foil 132 and the plating underlying conductive layer are removed using sulfuric acid-hydrogen peroxide-based soft etching, so that it is possible to obtain a substrate with a built-in component where wiring pattern is exposed Next, as illustrated in FIG. 18P, a solder resist 180 of a pattern having an opening in a land portion of the wiring pattern is printed on the exposed wiring pattern. Note that the solder resist 180 can also be formed by a roll coater using a film type. Next, electroless Ni plating is formed on the land portion of the opening in the solder resist 180 at 3 μm or more, and electroless Au plating is formed thereon at 0.03 μm or more. The electroless Au plating may be formed at 1 μm or more. Further, it is also possible to pre-coat a solder thereon. Alternatively, electrolytic Ni plating may be formed in the opening of the solder resist 180 at 3 μm or more, and electrolytic Au plating may be formed thereon at 0.5 μm or more. Moreover, in addition to the metal plating, an organic rust preventive film may be formed in the opening of the solder resist 180.

Also, a cream solder may be printed and applied as a connection terminal on a land for external connection, and a ball grid array (BGA) of a solder ball may be mounted. Further, as the connection terminal, a copper core ball, a copper pillar bump, a land grid array (LGA), or the like may be used.

The semiconductor laser 300, the photodiode 400, and the passive component 500 are mounted on the surface of the substrate 100 as thus manufactured, and a frame 600 and the diffuser plate 700 are attached. At this time, the photodiode 400 and the passive component 500 are disposed to face the side of the semiconductor laser 300 having the least number of pads. Thereafter, generally, after the process is performed in the form of a collective substrate, the outer shape is processed with a dicing saw or the like to be separated into individual pieces.

Note that the example has been described in the steps described above where the peelable copper foil 130 and the support plate 110 are used, but instead of these, a copper clad laminate (CCL) can also be used. Further, as the manufacturing method to have the component built in the substrate, a method of forming a cavity in the substrate and mounting the component may be used.

As described above, in the embodiment of the present technology, the capacitor 501 is disposed to face the side of the semiconductor laser 300 having the least number of pads. As a result, the wiring length of the path of the loop 509 can be shortened, and the rise and fall of the laser light emitted from the semiconductor laser 300 can be accelerated. Furthermore, by disposing the photodiode 400 to face the side of the semiconductor laser 300 having the least number of pads, it is possible to improve the incidence sensitivity and perform laser power control with high accuracy.

2. Application Example

"Electronic equipment"

Figure 19:
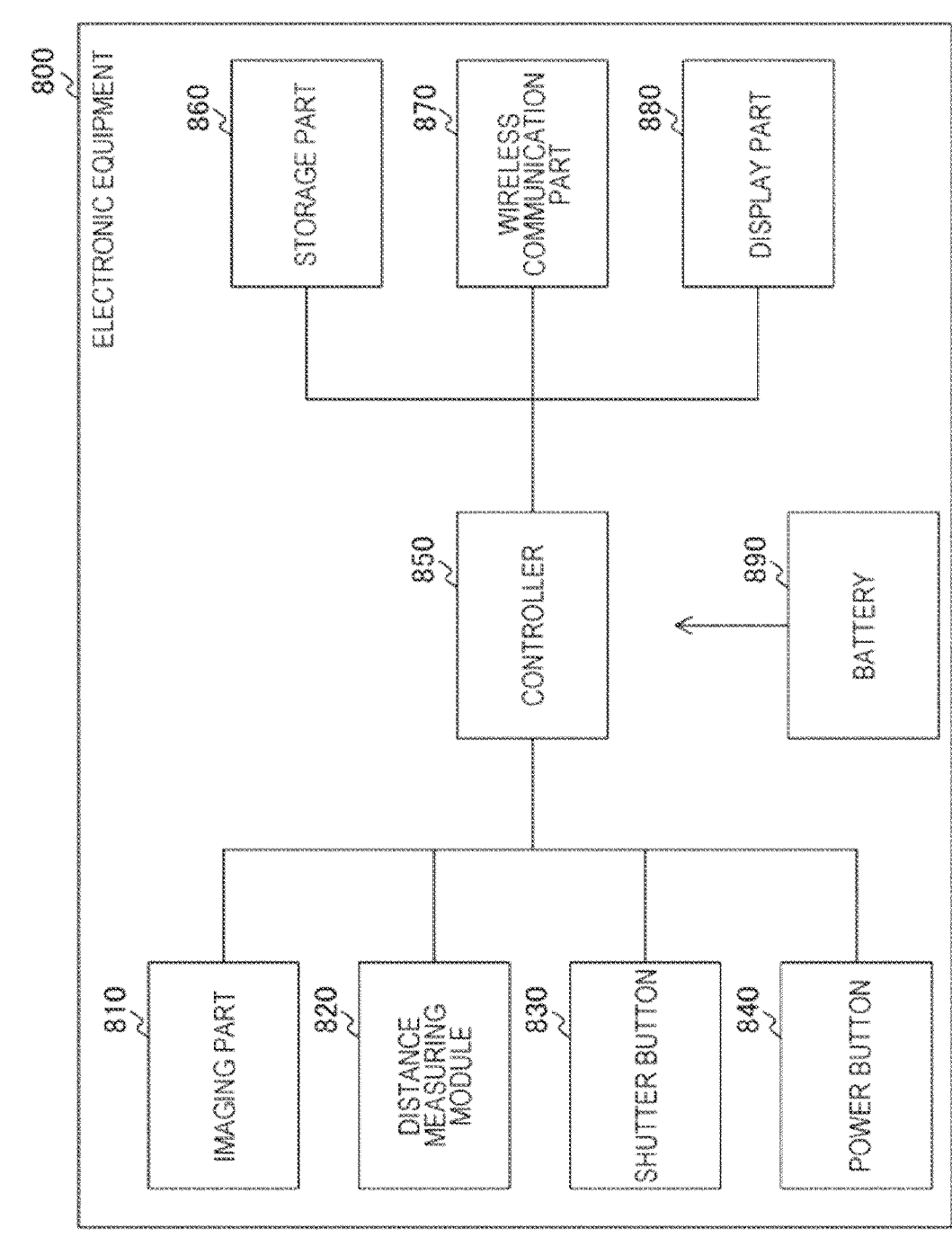
FIG. 19 is a diagram illustrating a system configuration example of electronic equipment 800 which is an application example of the embodiment of the present technology.

FIG. 19 is a diagram illustrating a system configuration example of electronic equipment 800 which is an application example of the embodiment of the present technology.

The electronic equipment 800 is a mobile terminal equipped with the distance measuring module 19 according to the embodiment described above. The electronic equipment 800 includes an imaging part 810, a distance measuring module 820, a shutter button 830, a power button 840, a controller 850, a storage part 860, a wireless communication part 870, a display part 880, and a battery 890.

The imaging part 810 is an image sensor that captures an image of a subject. The distance measuring module 820 is the distance measuring module 19 according to the embodiment described above.

The shutter button 830 is a button for giving an instruction on the imaging timing in the imaging part 810 from the outside of the electronic equipment 800. The power button 840 is a button for giving an instruction on on/off of the power of the electronic equipment 800 from the outside of electronic equipment 800.

The controller 850 is a processing part that controls the entire electronic equipment 800. The storage part 860 is a memory that stores data and programs necessary for the operation of the electronic equipment 800. The wireless communication part 870 performs wireless communication with the outside of the electronic equipment 800. The display part 880 is a display that displays an image and the like. The battery 890 is a power supply source that supplies power to each part of electronic equipment 800.

With a specific phase (e.g., rising timing) of a light emission control signal for controlling the distance measuring module 820 taken as 0 degrees, the imaging part 810 detects the amount of light received from 0 degrees to 180 degrees as Q1 and detects the amount of light received from 180 degrees to 360 degrees as Q2. Further, the imaging part 810 detects the amount of light received from 90 degrees to 270 degrees as Q3 and detects the amount of light received from 270 degrees to 90 degrees as Q4. From these amounts Q1 to Q4 of light received, the controller 850 calculates a distance d to the object according to the following equation and displays the distance d on the display part 880.

$$d = (c/4\pi f) \times \arctan\{(Q3-Q4)/(Q1-Q2)\}$$

In the above equation, the unit of the distance d is, for example, meters (m). c is the speed of light, and its unit is, for example, meters per second (m/s). arctan is an inverse function of a tangent function. A value of "(Q3−Q4)/(Q1−Q2)" indicates the phase difference between irradiation light and reflected light. π indicates Pi. Further, f is the frequency of the irradiation light, and its unit is, for example, megahertz (MHz).

Figure 20:
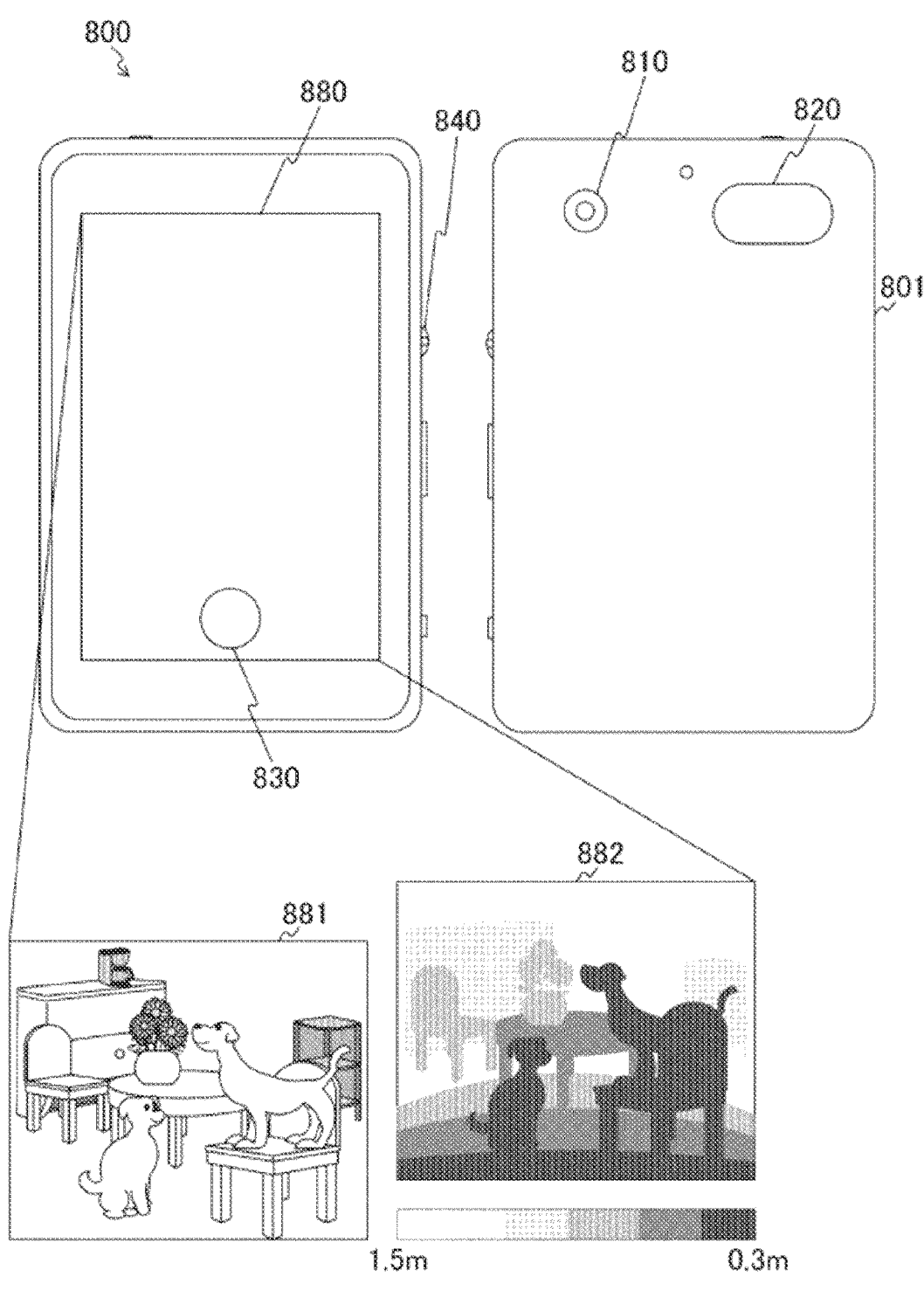
FIG. 20 is a view illustrating an external configuration example of the electronic equipment 800 which is an application example of the embodiment of the present technology.

FIG. 20 is a view illustrating an external configuration example of the electronic equipment 800 which is an application example of the embodiment of the present technology.

The electronic equipment 800 is housed in a housing 801 and includes a power button 840 on a side surface and a display part 880 and a shutter button 830 on a surface. In addition, optical regions of the imaging part 810 and the distance measuring module 820 are provided on the back surface.

As a result, the display part 880 can display not only the normal captured image 881 but also a depth image 882 corresponding to a result of distance measurement using ToF.

Note that although the mobile terminal such as a smartphone has been illustrated as the electronic equipment 800 in this application example, the electronic equipment 800 is not limited to this but may, for example, be a digital camera, a game machine, a wearable device, or the like.

Note that the embodiment described above shows an example for embodying the present technology, and the matters in the embodiment and the technology specifying matters in the claims have a corresponding relationship. Similarly, the technology specifying matters in the claims and the matters in the embodiment of the present technology to which the same names are assigned have a corresponding relationship. However, the present technology is not limited to the embodiment but can be embodied by applying various modifications to the embodiment without departing from the gist of the present technology.

Note that the effects described in the present specification are merely examples, are not limited, and may have other effects.

Note that the present technology can also have configurations as follows.

(1) A semiconductor laser drive device including:
    a substrate with a laser driver built inside;
    a semiconductor laser mounted on one surface of the substrate;
    connection wiring that electrically connects the laser driver and the semiconductor laser with a wiring inductance of 0.5 nH or less; and
    a passive component that is disposed to face a side of the semiconductor laser having the least number of pads and connects to the semiconductor laser and the laser driver.

(2) The semiconductor laser drive device according to (1) above, in which
    the passive component forms a part of a path through which the laser driver drives the semiconductor laser.

(3) The semiconductor laser drive device according to (1) or (2) above, in which
    at least a part of the passive component is disposed to overlap above the laser driver.

(4) The semiconductor laser drive device according to any one of (1) to (3) above, in which
    the passive component includes a capacitor.

(5) The semiconductor laser drive device according to (4) above, in which
    the capacitor is a decoupling capacitor that connects a power supply potential and a ground potential of the laser driver.

(6) The semiconductor laser drive device according to any one of (1) to (5) above, further including a photodiode that is disposed to face the side of the semiconductor laser having the least number of pads and monitors light intensity of laser light emitted from the semiconductor laser, in which the laser driver drives the semiconductor laser on the basis of the light intensity monitored by the photodiode.

(7) The semiconductor laser drive device according to any one of (1) to (6) above, in which the connection wiring has a length of 0.5 mm or less.

(8) The semiconductor laser drive device according to any one of (1) to (7) above, in which the connection wiring is through a connecting via provided on the substrate.

(9) The semiconductor laser drive device according to any one of (1) to (8) above, in which a part of the semiconductor laser is disposed to overlap above the laser driver.

(10) The semiconductor laser drive device according to (9) above, in which a portion of 50% or less of an area of the semiconductor laser is disposed to overlap above the laser driver.

(11) Electronic equipment including:

a substrate with a laser driver built inside;

a semiconductor laser mounted on one surface of the substrate;

connection wiring that electrically connects the laser driver and the semiconductor laser with a wiring inductance of 0.5 nH or less; and a passive component that is disposed to face a side of the semiconductor laser having the least number of pads and connects to the semiconductor laser and the laser driver.

(12) A method for manufacturing a semiconductor laser drive device, including:

forming a laser driver on an upper surface of a support plate;

forming connection wiring of the laser driver and forming a substrate with the laser driver built inside;

mounting a semiconductor laser on one surface of the substrate and forming connection wiring that electrically connects, via the connection wiring, the laser driver and the semiconductor laser with a wiring inductance of 0.5 nH or less; and disposing a passive component connecting the semiconductor laser and the laser driver to face a side of the semiconductor laser having the least number of pads.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

11 Light-emitting unit
12 Light-receiving unit
13 Light emission controller
14 Distance measuring operation part
19 Distance measuring module
21 Sensor
22 Lens
30 Interposer
50 Motherboard
100 Substrate
101 connecting via
110 Support plate
120 Adhesive resin layer 130 Peelable copper foil
131 Carrier copper foil
132 Ultra-thin copper foil
140 Solder resist
150 Wiring pattern
161 to 163 Interlayer insulating resin
170 to 172 Via hole
180 Solder resist
200 Laser driver
210 I/O pad
220 Protective insulation layer
230 Surface protection film
240 Adhesion layer—seed layer
250 Photoresist
260 Copper land—copper wiring layer (RDL)
290 Die attach film (DAF)
300 Semiconductor laser
302 Bonding wire
400 Photodiode
500 Passive component
501 Capacitor
600 Side wall
700 Diffuser plate
800 Electronic equipment
801 Housing
810 Imaging part
820 Distance measuring module
830 Shutter button
840 Power button
850 Controller
860 Storage part
870 Wireless communication part
880 Display part
890 Battery

What is claimed is:

1. A semiconductor laser drive device, comprising:
a substrate with a laser driver built inside;
a semiconductor laser mounted on one surface of the substrate;
connection wiring that electrically connects the laser driver and the semiconductor laser,
wherein the connection wiring has a wiring inductance of 0.5 nH or less; and
a passive component that is disposed to face a side of the semiconductor laser having a least number of pads and connects to the semiconductor laser and the laser driver,
wherein the passive component is provided on a same plane as the semiconductor laser in a cross-sectional view, and
wherein at least a part of the passive component is disposed to overlap above the laser driver.

2. The semiconductor laser drive device according to claim 1, wherein the passive component forms a part of a path through which the laser driver drives the semiconductor laser.

3. The semiconductor laser drive device according to claim 1, wherein the passive component includes a capacitor.

4. The semiconductor laser drive device according to claim 3, wherein the capacitor is a decoupling capacitor that connects a power supply potential and a ground potential of the laser driver.

5. The semiconductor laser drive device according to claim 1, further comprising:

a photodiode that is disposed to face the side of the semiconductor laser having the least number of pads and monitors light intensity of laser light emitted from the semiconductor laser, wherein the laser driver drives the semiconductor laser on a basis of the light intensity monitored by the photodiode.

6. The semiconductor laser drive device according to claim 1, wherein the connection wiring has a length of 0.5 mm or less.

7. The semiconductor laser drive device according to claim 1, wherein the connection wiring is through a connecting via provided on the substrate.

8. The semiconductor laser drive device according to claim 1, wherein a part of the semiconductor laser is disposed to overlap above the laser driver.

9. The semiconductor laser drive device according to claim 8, wherein a portion of 50% or less of an area of the semiconductor laser is disposed to overlap above the laser driver.

10. A method for manufacturing a semiconductor laser drive device, comprising:

forming a laser driver on an upper surface of a support plate;

forming connection wiring of the laser driver and forming a substrate with the laser driver built inside;

mounting a semiconductor laser on one surface of the substrate and forming connection wiring that electrically connects, via the connection wiring, the laser driver and the semiconductor laser, wherein the connection wiring has with a wiring inductance of 0.5 nH or less; and disposing a passive component connecting the semiconductor laser and the laser driver to face a side of the semiconductor laser having a least number of pads, wherein the passive component is provided on a same plane as the semiconductor laser in a cross-sectional view, and wherein at least a part of the passive component is disposed to overlap above the laser driver.

11. Electronic equipment, comprising:

an optical system;

semiconductor laser drive device that receives light from the optical system, the semiconductor laser device including:

a substrate with a laser driver built inside;

a semiconductor laser mounted on one surface of the substrate;

connection wiring that electrically connects the laser driver and the semiconductor laser, wherein the connection wiring has with a wiring inductance of 0.5 nH or less; and a passive component that is disposed to face a side of the semiconductor laser having a least number of pads and connects to the semiconductor laser and the laser driver, wherein the passive component is provided on a same plane as the semiconductor laser in a cross-sectional view; and a controller that processes signals from the semiconductor laser drive device.

12. The electronic equipment according to claim 11, wherein the passive component forms a part of a path through which the laser driver drives the semiconductor laser.

13. The electronic equipment according to claim 11, wherein at least a part of the passive component is disposed to overlap above the laser driver.

14. The electronic equipment according to claim 11, wherein the passive component includes a capacitor.

15. The electronic equipment according to claim 14, wherein the capacitor is a decoupling capacitor that connects a power supply potential and a ground potential of the laser driver.

16. The electronic equipment according to claim 11, further comprising:

a photodiode that is disposed to face the side of the semiconductor laser having the least number of pads and monitors light intensity of laser light emitted from the semiconductor laser, wherein the laser driver drives the semiconductor laser on a basis of the light intensity monitored by the photodiode.

17. The electronic equipment according to claim 11, wherein the connection wiring has a length of 0.5 mm or less.

18. The electronic equipment according to claim 11, wherein a part of the semiconductor laser is disposed to overlap above the laser driver.

19. The electronic equipment according to claim 18, wherein a portion of 50% or less of an area of the semiconductor laser is disposed to overlap above the laser driver.

20. The method for manufacturing a semiconductor laser drive device according to claim 10, wherein the passive component includes a capacitor.

\* \* \* \* \*